(12) United States Patent
Bhintade et al.

(10) Patent No.: US 9,923,035 B2
(45) Date of Patent: Mar. 20, 2018

(54) METHOD FOR PRODUCING ORGANIC ELECTRONIC DEVICES WITH BANK STRUCTURES, BANK STRUCTURES AND ELECTRONIC DEVICES PRODUCED THEREWITH

(71) Applicant: MERCK PATENT GMBH, Darmstadt (DE)

(72) Inventors: Rashmi Bhintade, Winchester (GB); Li Wei Tan, Eastleigh (GB); Tomas Backlund, Southampton (GB)

(73) Assignee: MERCK PATENT GMBH, Darmstadt (DE)

( * ) Notice: Subject to any disclaimer, the term of this patent is extended or adjusted under 35 U.S.C. 154(b) by 7 days.

(21) Appl. No.: 14/441,208

(22) PCT Filed: Oct. 16, 2013

(86) PCT No.: PCT/EP2013/003109
§ 371 (c)(1),
(2) Date: May 7, 2015

(87) PCT Pub. No.: WO2014/072016
PCT Pub. Date: May 15, 2014

(65) Prior Publication Data
US 2015/0270318 A1    Sep. 24, 2015

(30) Foreign Application Priority Data

Nov. 8, 2012  (EP) .................................... 12007585

(51) Int. Cl.
*H01L 27/32*   (2006.01)
*H01L 51/10*   (2006.01)
*H01L 51/05*   (2006.01)
*H01L 51/00*   (2006.01)

(52) U.S. Cl.
CPC ...... *H01L 27/3246* (2013.01); *H01L 27/3283* (2013.01); *H01L 51/052* (2013.01); *H01L 51/0541* (2013.01); *H01L 51/0545* (2013.01); *H01L 51/105* (2013.01); *H01L 51/0035* (2013.01); *H01L 51/0043* (2013.01)

(58) Field of Classification Search
CPC ............... H01L 27/3246; H01L 51/105; H01L 51/0541; H01L 51/0545; H01L 51/052
See application file for complete search history.

(56) References Cited

U.S. PATENT DOCUMENTS

| | | |
|---|---|---|
| 2005/0067946 A1 | 3/2005 | Park |
| 2005/0082515 A1 | 4/2005 | Masuichi et al. |
| 2012/0056183 A1 | 3/2012 | Mueller et al. |

FOREIGN PATENT DOCUMENTS

JP    2002025767 A    1/2002

OTHER PUBLICATIONS

International Search Report dated Dec. 19, 2013 issued in corresponding PCT/EP2013/003109 application (pp. 1-3).

*Primary Examiner* — Joseph L Williams
(74) *Attorney, Agent, or Firm* — Millen White Zelano and Branigan, PC; Csaba Henter

(57) ABSTRACT

The present invention relates to a process for producing an organic electronic device, wherein a layer is selectively swelled with a swelling solvent so as to form bank structures allowing the deposition of the semiconductor material in a specific and well-defined area. The present invention further relates to bank structures, organic electronic devices and products or assemblies produced by said process.

24 Claims, 3 Drawing Sheets

METHOD FOR PRODUCING ORGANIC ELECTRONIC DEVICES WITH BANK STRUCTURES, BANK STRUCTURES AND ELECTRONIC DEVICES PRODUCED THEREWITH

TECHNICAL FIELD

The present invention relates to a process for producing an organic electronic device, wherein a layer is selectively swelled with a swelling solvent so as to form bank structures allowing the deposition of the semiconductor material in a specific and well-defined area. The present invention further relates to bank structures, organic electronic devices and products or assemblies produced by said process.

BACKGROUND AND DESCRIPTION OF THE PRIOR ART

The improvement in performance of an organic electronic device, i.e. an electronic device with a functional layer comprising an organic material, such as for example an organic field effect transistor (OFET) or an organic light emitting diode (OLED), depends to some extent on the ability to deposit individual functional layers, such as for example the semiconductor layer, in a specific, confined place on the substrate.

In this respect, so-called bank structures are known to be useful in defining such specific confined places on a substrate. For example, US 2007/0023837 A1, WO 2008/117395 A1, EP 1 933 393 A1, GB 2,458,454 A, GB 2,462,845 A, US 2003/017360 A1, US 2007/190673 A1, WO 2007/023272 A1 and WO 2009/077738 A1 individually and collectively are representative disclosures of such known structures and methods of forming them.

However, while allowing to deposit individual functional layers in a confined place, these methods have also necessitated an additional production step, in which the bank structures are formed by depositing them onto the already present layers. So as not to harm the already present layers special care needs to be taken not to negatively affect the performance of the so-produced organic electronic device.

There is therefore a need in the industry for a simple and easy-to-perform process for producing organic electronic devices with bank structures.

Consequently it is an object of the present invention to provide an improved process for the production of organic electronic devices with bank structures.

It is also an object of the present invention to provide a process for the production of organic electronic devices, said process being simple and easy to perform.

It is a further object of the present invention to provide a process for the production of organic electronic devices with bank structures, wherein the bank structures are well defined.

It is a further object of the present invention to provide a process for the production of organic electronic devices with bank structures, wherein the organic electronic devices show good performance.

SUMMARY OF THE INVENTION

It has now surprisingly been found that the above objects may be attained either individually or in any combination by the process of the present application.

The present application therefore provides for a process for preparing an electronic device, wherein a layer is selectively swelled with a swelling solvent, thereby forming bank structures, which define a well.

Further preferred processes provided for by the present application are as indicated in the dependent claims.

In addition, the present application relates to a bank structure obtained by the present process, an organic electronic device comprising such a bank structure as well as a product or assembly comprising such organic electronic device.

DETAILED DESCRIPTION OF THE INVENTION

Figure 1:
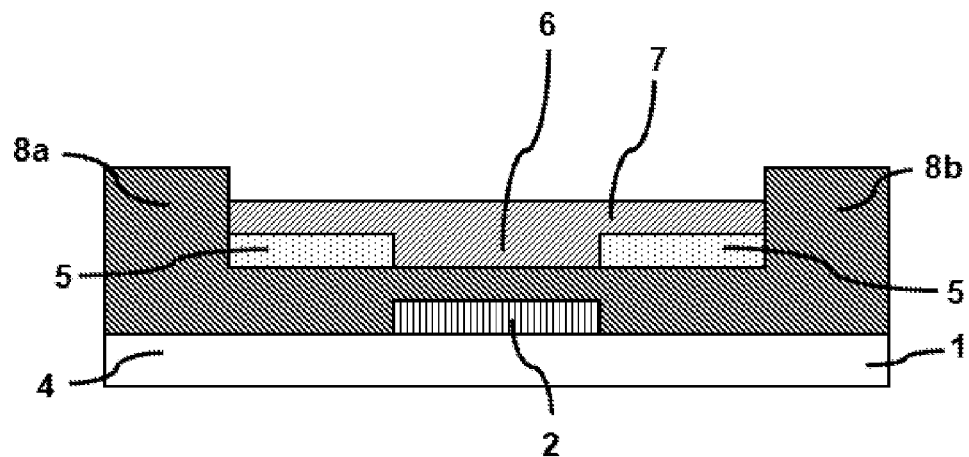
FIG. 1 is an exemplary schematic representation of a bottom gate organic field effect transistor device in accordance with the present invention.

As used herein, the term "organic field effect transistor" (OFET) will be understood to be inclusive of the subclass of such devices known as "organic thin film transistor" (OTFT).

In addition, it will be understood that the terms "dielectric" and "insulating" are used interchangeably herein.

Further, as used herein, the term "organic electronic device" will be understood to be inclusive of the term "organic semiconductor device" and the several specific implementations of such devices such as the organic field effect transistors as defined above.

As used herein, the terms "orthogonal" and "orthogonality" will be understood to mean chemical orthogonality. For example, an orthogonal solvent means a solvent which, when used in the deposition of a layer of a material dissolved therein on a previously deposited layer, does not dissolve said previously deposited layer.

As used herein, the terms "insulating structure(s)" and "bank structure(s)" will be understood to mean a patterned structure, for example a patterned layer, that is provided on an underlying substrate and defines a specific structure, for example a well, on said substrate that can be filled by a functional material like a semiconductor or a dielectric. The patterned structure comprises a structure defining material that is selected such that a surface energy contrast is created between said patterned structure and said substrate. Usually the substrate has a higher surface energy while the patterned structure has a lower surface energy. The substrate is for example a functional layer of an electronic device, like an electrode, a semiconducting layer or a dielectric layer. The insulating or bank structure is used to define more easily the active area of a solution-processed thin film of, for example, the semiconductor in an electronic device, by using the tendency of the liquid solution to move and stick to the area having higher surface energy, i.e., the substrate. By confining the liquid in a given area, a thin film can be formed as needed in the specific device application. This provides certain benefits, as for example in organic field effect transistors the confined area of organic semiconductor improves the off-state current. It will be understood that the terms "bank structure(s)" and "insulating structure(s)" are used interchangeably herein. Thus reference to a bank structure is inclusive of an insulating structure.

As used herein, the term "polymer" will be understood to mean a molecule that encompasses a backbone of one or more distinct types of repeating units (the smallest constitutional unit of the molecule) and is inclusive of the commonly known terms "oligomer", "copolymer", "homopolymer" and the like. Further, it will be understood that the term polymer is inclusive of, in addition to the polymer itself, residues from initiators, catalysts and other elements attendant to the synthesis of such a polymer, where such residues are understood as not being covalently incorporated thereto. Further, such residues and other elements, while normally removed during post polymerization purification processes, are typically mixed or co-mingled with the polymer such that they generally remain with the polymer when it is transferred between vessels or between solvents or dispersion media.

As used herein, the term "polymer composition" means at least one polymer and one or more other materials added to the at least one polymer to provide, or to modify, specific properties of the polymer composition and/or the at least one polymer therein. It will be understood that a polymer composition is a vehicle for carrying the polymer to a substrate to enable the forming of layers or structures thereon. Exemplary materials include, but are not limited to, solvents, antioxidants, photoinitiators, photosensitizers, crosslinking moieties or agents, reactive diluents, acid scavengers, leveling agents and adhesion promoters. Further, it will be understood that a polymer composition may, in addition to the aforementioned exemplary materials, also encompass a blend of two or more polymers.

The present electronic device comprises a substrate, a gate electrode, source and drain electrodes, a channel region located between said source and drain electrodes, bank structures defining a well, and a layer of semiconductor material. Additionally, and depending upon the design, said electronic device may comprise further components. For example it may further comprise a dielectric layer. Or alternatively said electronic device may further comprise a planarization layer and a gate insulator layer.

Preferably, the electronic device of the present invention is an organic electronic device. More preferably, it is selected from the group consisting of organic field effect transistor (OFET), organic thin film transistor (OTFT), organic light emitting diode (OLED) and organic photovoltaic device. Even more preferably, it is an organic field effect transistor (OFET) or an organic light emitting diode (OLED). Most preferably, it is a top gate organic field effect transistor or a bottom gate organic field effect transistor.

Figure 2:
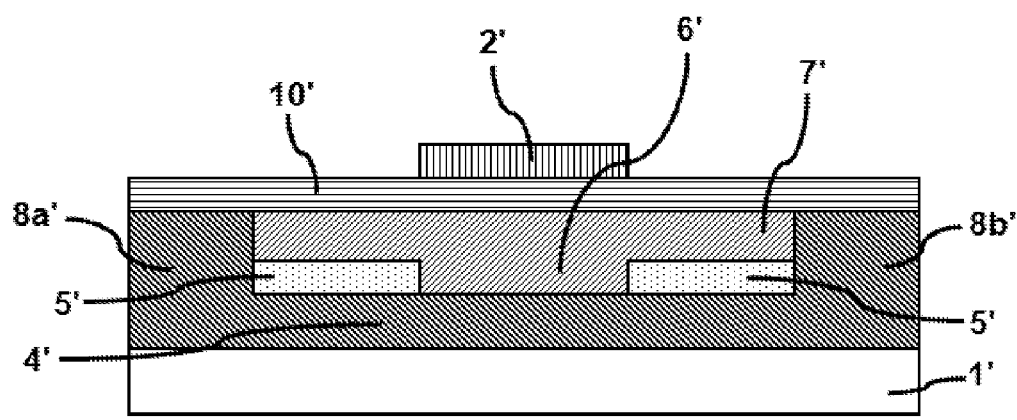
FIG. 2 is an exemplary schematic representation of a top gate organic field effect transistor device in accordance with the present invention.

Examples of electronic devices in accordance with the present invention are schematically shown in FIG. 1 and FIG. 2.

FIG. 1 shows an exemplary schematic representation of a bottom gate organic thin film transistor in accordance with the present invention with substrate (1), gate electrode (2), dielectric layer (3), source and drain electrodes (5), channel region (6), layer of semiconductor material (7), bank structures (8a, 8b) and well.

FIG. 2 shows an exemplary schematic representation of a top gate organic thin film transistor in accordance with the present invention with substrate (1'), gate electrode (2'), planarization layer (4'), source and drain electrodes (5'), channel region (6'), layer of semiconducting material (7'), bank structures (8a', 8b'), well and gate insulating layer (10').

Figure 3:
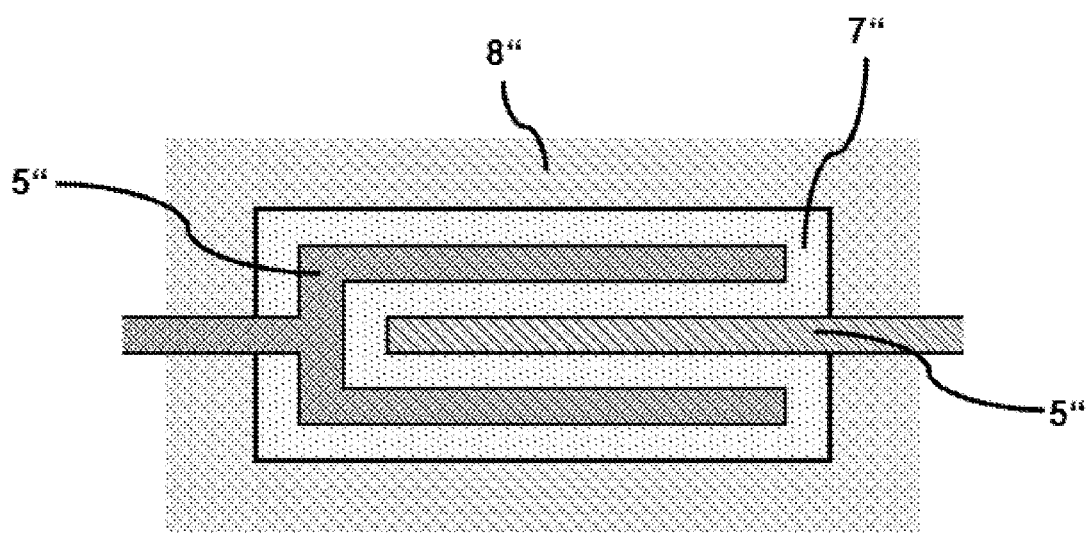
FIG. 3 is an exemplary schematic representation of a part of an organic field effect transistor device in accordance with the present invention.

FIG. 3 shows an exemplary schematic representation of a part of an organic thin film transistor in accordance with the present invention with source and drain electrodes (5"), layer of semiconductor material (7") and bank structure (8"). It is noted that the layer of semiconductor material (7") is confined to a well, the borders of which are defined by the bank structure (8") and which encompasses the channel region between source and drain electrodes (5").

Substrate, gate electrode, source and drain electrodes, semiconducting material as well as the gate insulating layer may be selected from materials that are well known to the skilled person. They can also be manufactured and integrated into the device by standard methods. Exemplary deposition methods include liquid coating as well as chemical vapor deposition, frequently abbreviated as "CVD", or physical vapor deposition. All of these are well known to the skilled person and can be found in the literature.

Preferably, the thickness of a functional layer, for example of a dielectric layer, a semiconducting layer, a planarization layer or a gate insulator layer, is in the range from 0.001 µm to 10 µm. More preferably said thickness is in the range from 0.001 µm to 1 µm, and most preferably in the range from 5 nm to 500 nm: However, other thicknesses may be used as well.

Depending upon the design of the electronic device, the present bank structures are generally, though not necessarily, derived from either the dielectric layer or the planarization layer. Thus, bank structures, dielectric layer and planarization layer comprise a polycycloolefinic polymer as defined below. The present bank structures can be used in a wide variety of electronic devices, especially in organic field effect transistors (OFETs) and organic light emitting diodes (OLEDs).

Preferably, the ratio of the thickness of the bank structures to the thickness of the dielectric layer or the planarization layer in the channel region is at least 1.2.

Substrate

The substrate used for the present electronic device may be any suitable material. Examples of such materials are glass and polymeric materials. Preferred polymeric material include but are not limited to alkyd resins, allyl esters, benzocyclobutenes, butadiene-styrene, cellulose, cellulose acetate, epoxide, epoxy polymers, ethylene-chlorotrifluoro ethylene copolymers, ethylene-tetra-fluoroethylene copolymers, fiber glass enhanced polymers, fluorocarbon polymers, hexafluoropropylenevinylidene-fluoride copolymer, high density polyethylene, parylene, polyamide, polyimide, polyaramid, polydimethylsiloxane, polyethersulphone, polyethylene, polyethylenenaphthalate, polyethyleneterephthalate, polyketone, polymethylmethacrylate, polypropylene, polystyrene, polysulphone, polytetrafluoroethylene, polyurethanes, polyvinylchloride, polycycloolefin, silicone rubbers, and silicones. Of these polyethyleneterephthalate, polyimide, polycycloolefin and polyethylenenaphthalate materials are more preferred. Additionally, for some embodiments of the present invention the substrate can be any suitable material, for example a polymeric material, metal or glass material coated with one or more of the above listed materials. It will be understood that in forming such a substrate, methods such as extruding, stretching, rubbing or photochemical techniques can be employed to provide a homogeneous surface for device fabrication as well as to provide pre-alignment of an organic semiconductor material in order to enhance carrier mobility therein. Alternatively, the substrate can be a polymeric material, metal or glass coated with one or more of the above polymeric materials.

Electrodes

The gate electrode as well as the source and drain electrodes of the present electronic device may be of any suitable electrode material. Such electrode materials include, without limitation inorganic or organic materials, or blends thereof. Exemplary electrode materials include polyaniline, polypyrrole, poly(3,4-ethylenedioxythiophene) (PEDOT) or doped conjugated polymers, further dispersions or pastes of graphite or particles of metal such as Au, Ag, Cu, Al, Ni, Mo or their mixtures as well as sputter coated or evaporated metals such as Cu, Cr, Pt/Pd, Ag, Au or metal oxides such as indium tin oxide (ITO), F-doped ITO or Al-doped ZnO. Organometallic precursors may also be used and deposited from a liquid phase. The gate electrode as well as the source and drain electrodes may be deposited or formed by liquid coating such as for example spray-coating, dip-coating, web-coating or spin-coating, or by vacuum deposition methods including for example physical vapor deposition, chemical vapor deposition, or thermal evaporation methods. Suitable electrode materials and methods for forming the electrodes are generally known to the skilled person and can easily be found in the literature.

Semiconductor

The semiconductor material can be any n-type or p-type organic semiconductor material. Preferably, said semiconductor material has a field effect transistor mobility of at least $1 \cdot 10^{-5}$ cm$^2$V$^{-1}$ s$^{-1}$.

OSC embodiments in accordance with the present invention can be either OFETs where the OSC is used as the active channel material, OPV devices where the OSC is used as charge carrier material, or organic rectifying diodes (ORDs) where the OSC is a layer element of such a diode. OSCs for such embodiments can be deposited by any of the previously discussed deposition methods, but as they are generally deposited or formed as blanket layers, solvent coating methods such as spray-, dip-, web- or spin-coating, or printing methods such as ink-jet printing, flexo printing or gravure printing, are typically employed to allow for ambient temperature processing. However, OSCs can be deposited by any liquid coating technique, for example ink-jet deposition or via PVD or CVD techniques.

For some preferred OFET embodiments, the semiconducting layer that is formed can be a composite of two or more of the same or different types of semiconductors. For example, a p-type OSC material may, for example, be mixed with an n-type material to achieve a doping effect of the layer. In some preferred embodiments of the invention, multilayer semiconductor layers are used. For example an intrinsic semiconductor layer can be deposited near the gate dielectric interface and a highly doped region can additionally be coated adjacent to such an intrinsic layer.

The OSC material employed for electronic device embodiments in accordance with the present invention can be any conjugated molecule, for example an aromatic molecule containing preferably two or more, very preferably at least three aromatic rings. In some preferred embodiments of the present invention, the OSC contains aromatic rings selected from 5-, 6- or 7-membered aromatic rings, while in other preferred embodiments the OSC contains aromatic rings selected from 5- or 6-membered aromatic rings. The OSC material may be a monomer, oligomer or polymer, including mixtures, dispersions and blends of one or more of monomers, oligomers or polymers.

Each of the aromatic rings of the OSC optionally contains one or more hetero atoms selected from Se, Te, P, Si, B, As, N, O or S, generally from N, O or S. Further, the aromatic rings may be optionally substituted with alkyl, alkoxy, polyalkoxy, thioalkyl, acyl, aryl or substituted aryl groups, halogen, where fluorine, cyano, nitro or an optionally substituted secondary or tertiary alkylamine or arylamine represented by —N(R$^{15}$)(R$^{16}$), where R$^{15}$ and R$^{16}$ are each independently H, an optionally substituted alkyl or an optionally substituted aryl, alkoxy or polyalkoxy groups are typically employed. Further, where R$^{15}$ and R$^{16}$ is alkyl or aryl these may be optionally fluorinated.

The aforementioned aromatic rings can be fused rings or linked with a conjugated linking group such as —C(T$_1$)=C(T$_2$)-, —C≡C—, —N(R''')—, —N=N—, (R''')=N—, —N=C(R''')—, where T$_1$ and T$_2$ each independently represent H, Cl, F, —CN or lower alkyl groups such as C$_{1-4}$ alkyl groups; R''' represents H, optionally substituted alkyl or optionally substituted aryl. Further, where R''' is alkyl or aryl it can be fluorinated.

In some preferred OE device embodiments of the present invention, OSC materials that can be used include compounds, oligomers and derivatives of compounds selected from the group consisting of conjugated hydrocarbon polymers such as polyacene, polyphenylene, poly(phenylene vinylene), polyfluorene including oligomers of those conjugated hydrocarbon polymers; condensed aromatic hydrocarbons, such as, tetracene, chrysene, pentacene, pyrene, perylene, coronene, or soluble, substituted derivatives of these; oligomeric para substituted phenylenes such as p-quaterphenyl (p-4P), p-quinquephenyl (p-5P), p-sexiphenyl (p-6P), or soluble substituted derivatives of these; conjugated heterocyclic polymers such as poly(3-substituted thiophene), poly(3,4-bisubstituted thiophene), optionally substituted polythieno[2,3-b]thiophene, optionally substituted polythieno[3,2-b]thiophene, poly(3-substituted selenophene), polybenzothiophene, polyisothianapthene, poly(N-substituted pyrrole), poly(3-substituted pyrrole), poly(3,4-bisubstituted pyrrole), polyfuran, polypyridine, poly-1,3,4-oxadiazoles, polyisothianaphthene, poly(N-substituted aniline), poly(2-substituted aniline), poly(3-substituted aniline), poly(2,3-bisubstituted aniline), polyazulene, polypyrene; pyrazoline compounds; polyselenophene; polybenzofuran; polyindole; polypyridazine; benzidine compounds; stilbene compounds; triazines; substituted metallo- or metal-free porphines, phthalocyanines, fluorophthalocyanines, naphthalocyanines or fluoronaphthalocyanines; C$_{60}$ and C$_{70}$ fullerenes; N,N'-dialkyl, substituted dialkyl, diaryl or substituted diary)-1,4,5,8-naphthalenetetracarboxylic diimide and fluoro derivatives; N,N'-dialkyl, substituted dialkyl, diaryl or substituted diaryl 3,4,9,10-perylenetetracarboxylicdiimide; bathophenanthroline; diphenoquinones; 1,3,4-oxadiazoles; 11,11,12,12-tetracyanonaptho-2,6-quinodimethane; axe-bis(dithieno[3,2-b2',3'-d]thiophene); 2,8-dialkyl, substituted dialkyl, diaryl or substituted diaryl anthradithiophene; 2,2'-bisbenzo[1,2-b:4,5-b']dithiophene. Where a liquid deposition technique of the OSC is desired, compounds from the above list and derivatives thereof are limited to those that are soluble in an appropriate solvent or mixture of appropriate solvents.

Further, in some preferred embodiments in accordance with the present invention, the OSC materials are polymers or copolymers that encompass one or more repeating units selected from thiophene-2,5-diyl, 3-substituted thiophene-2,5-diyl, optionally substituted thieno[2,3-b]thiophene-2,5-diyl, optionally substituted thieno[3,2-b]thiophene-2,5-diyl, selenophene-2,5-diyl, or 3-substituted selenophene-2,5-diyl.

Further preferred p-type OSCs are copolymers comprising electron acceptor and electron donor units. Preferred copolymers of this preferred embodiment are for example copolymers comprising one or more benzo[1,2-b:4,5-b']

dithiophene-2,5-diyl units that are preferably 4,8-disubstituted by one or more groups R as defined above, and further comprising one or more aryl or heteroaryl units selected from Group A and Group B, preferably comprising at least one unit of Group A and at least one unit of Group B, wherein Group A consists of aryl or heteroaryl groups having electron donor properties and Group B consists of aryl or heteroaryl groups having electron acceptor properties, and preferably Group A consists of selenophene-2,5-diyl, thiophene-2,5-diyl, thieno[3,2-b]thiophene-2,5-diyl, thieno[2,3-b]thiophene-2,5-diyl, selenopheno[3,2-b]selenophene-2,5-diyl, selenopheno[2,3-b]selenophene-2,5-diyl, selenopheno[3,2-b]thiophene-2,5-diyl, selenopheno[2,3-b]thiophene-2,5-diyl, benzo[1,2-b:4,5-b']dithiophene-2,6-diyl, 2,2-dithiophene, 2,2-diselenophene, dithieno[3,2-b:2',3'-d]silole-5,5-diyl, 4H-cyclopenta[2,1-b:3,4-b']dithiophene-2,6-diyl, 2,7-di-thien-2-yl-carbazole, 2,7-di-thien-2-yl-fluorene, indaceno[1,2-b:5,6-b']dithiophene-2,7-diyl, benzo[1'',2'':4,5;4'',5'':4',5']bis(silolo[3,2-b:3',2'-b']thiophene)-2,7-diyl, 2,7-di-thien-2-yl-indaceno[1,2-b:5,6-b']dithiophene, 2,7-di-thien-2-yl-benzo[1'',2'':4,5;4'',5'':4',5']bis(silolo[3,2-b:3',2'-b']thiophene)-2,7-diyl, and 2,7-di-thien-2-yl-phenanthro[1,10,9,8-c,d,e,f,g]carbazole, all of which are optionally substituted by one or more, preferably one or two groups R as defined above, and Group B consists of benzo[2,1,3]thiadiazole-4,7-diyl, 5,6-dialkyl-benzo[2,1,3]thiadiazole-4,7-diyl, 5,6-dialkoxybenzo[2,1,3]thiadiazole-4,7-diyl, benzo[2,1,3]selenadiazole-4,7-diyl, 5,6-dialkoxy-benzo[2,1,3]selenadiazole-4,7-diyl, benzo[1,2,5]thiadiazole-4,7,diyl, benzo[1,2,5]selenadiazole-4,7,diyl, benzo[2,1,3]oxadiazole-4,7-diyl, 5,6-dialkoxy-benzo[2,1,3]oxadiazole-4,7-diyl, 2H-benzotriazole-4,7-diyl, 2,3-dicyano-1,4-phenylene, 2,5-dicyano,1,4-phenylene, 2,3-difluro-1,4-phenylene, 2,5-difluoro-1,4-phenylene, 2,3,5,6-tetrafluoro-1,4-phenylene, 3,4-difluorothiophene-2,5-diyl, thieno[3,4-b]pyrazine-2,5-diyl, quinoxaline-5,8-diyl, thieno[3,4-b]thiophene-4,6-diyl, thieno[3,4-b]thiophene-6,4-diyl, and 3,6-pyrrolo[3,4-c]pyrrole-1,4-dione, all of which are optionally substituted by one or more, preferably one or two groups R as defined above.

In other preferred embodiments of the present invention, the OSC materials are substituted oligoacenes such as pentacene, tetracene or anthracene, or heterocyclic derivatives thereof. Bis(trialkylsilylethynyl) oligoacenes or bis(trialkylsilylethynyl) heteroacenes, as disclosed for example in U.S. Pat. No. 6,690,029 or WO 2005/055248 A1 or U.S. Pat. No. 7,385,221, are also useful.

Where appropriate and needed to adjust the rheological properties as described for example in WO 2005/055248 A1, some embodiments of the present invention employ OSC compositions that include one or more organic binders.

The binder, which is typically a polymer, may comprise either an insulating binder or a semiconducting binder, or mixtures thereof may be referred to herein as the organic binder, the polymeric binder, or simply the binder.

Preferred binders according to the present invention are materials of low permittivity, that is, those having a permittivity ∈ of 3.3 or less. The organic binder preferably has a permittivity ∈ of 3.0 or less, more preferably 2.9 or less. Preferably the organic binder has a permittivity ∈ of 1.7 or more. It is especially preferred that the permittivity of the binder is in the range from 2.0 to 2.9. Whilst not wishing to be bound by any particular theory it is believed that the use of binders with a permittivity ∈ of greater than 3.3, may lead to a reduction in the OSC layer mobility in an electronic device, for example an OFET. In addition, high permittivity binders could also result in increased current hysteresis of the device, which is undesirable.

Examples of suitable organic binders include polystyrene, or polymers or copolymers of styrene and α-methyl styrene; or copolymers including styrene, α-methylstyrene and butadiene may suitably be used. Further examples of suitable binders are disclosed for example in US 2007/0102696 A1.

In one type of preferred embodiment, the organic binder is one in which at least 95%, more preferably at least 98% and especially all of the atoms consist of hydrogen, fluorine and carbon atoms.

The binder is preferably capable of forming a film, more preferably a flexible film.

The binder can also be selected from crosslinkable binders such as acrylates, epoxies, vinylethers, and thiolenes, preferably having a sufficiently low permittivity, very preferably of 3.3 or less. The binder can also be mesogenic or liquid crystalline.

In another preferred embodiment the binder is a semiconducting binder, which contains conjugated bonds, especially conjugated double bonds and/or aromatic rings. Suitable and preferred binders are for example polytriarylamines as disclosed for example in U.S. Pat. No. 6,630,566.

The proportions of binder to OSC is typically 20:1 to 1:20 by weight, preferably 10:1 to 1:10 more preferably 5:1 to 1:5, still more preferably 3:1 to 1:3 further preferably 2:1 to 1:2 and especially 1:1. Dilution of the compound of formula I in the binder has been found to have little or no detrimental effect on the charge mobility, in contrast to what would have been expected from the prior art.

Planarization Layer, Dielectric Layer and Gate Insulation Layer

The planarization layer, the dielectric layer and the gate insulation layer of the present electronic device may be of any suitable dielectric material. The preferred dielectric material is a polycycloolefin as defined below.

The present field effect transistors preferably employ a dielectric layer that consists of a dielectric material having a permittivity ∈ of at most 3.0. More preferably said permittivity ∈ is in the range from 1.3 to 3.0, even more preferably from 1.7 to 3.0, still even more preferably from 2.0 to 3.0 or from 2.5 to 3.0. Alternatively in some field effect transistors, said permittivity ∈ may be from 2.0 to 2.6.

As defined herein, the terms "polycycloolefin", "polycyclic olefin", and "norbornene-type" are used interchangeably and refer to addition-polymerizable monomers, or the resulting repeating unit, encompassing at least one norbornene moiety such as shown by either Structure A1 or A2, below. The simplest norbornene-type or polycyclic olefin monomer bicyclo[2.2.1]hept-2-ene (A1) is commonly referred to as norbornene.

(A1)

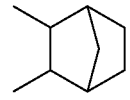

(A2)

However, the term "norbornene-type monomer" or "norbornene-type repeating unit", as used herein, is understood to not only mean norbornene itself but also to refer to any substituted norbornene, or substituted and unsubstituted higher cyclic derivatives thereof, for example of Structures B1 and B2, shown below, wherein m is an integer greater than zero.

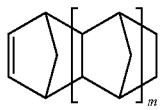

(B1)

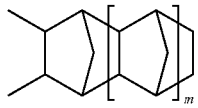

(B2)

By the substitution of a norbornene-type monomer with a pendant group, the properties of a polymer formed therefrom can be tailored to fulfill the needs of individual applications. The procedures and methods that have been developed to polymerize functionalized norbornene-type monomers exhibit an outstanding flexibility and tolerance to various moieties and groups of the monomers. In addition to polymerization of monomers with a specific pendant group, monomers having a variety of distinct functionalities can be randomly polymerized to form a final material where the types and ratios of monomers used dictate the overall bulk properties of the resulting polymer.

As used herein, "hydrocarbyl" refers to a radical or group that contains a carbon backbone where each carbon is appropriately substituted with one or more hydrogen atoms. The term "halohydrocarbyl" refers to a hydrocarbyl group where one or more of the hydrogen atoms, but not all, have been replaced by a halogen (F, Cl, Br, or I). The term perhalocarbyl refers to a hydrocarbyl group where each hydrogen has been replaced by a halogen. Non-limiting examples of hydrocarbyls, include, but are not limited to a $C_1$-$C_{25}$ alkyl, a $C_2$-$C_{24}$ alkenyl, a $C_2$-$C_{24}$ alkynyl, a $C_5$-$C_{25}$ cycloalkyl, a $C_6$-$C_{24}$ aryl or a $C_7$-$C_{24}$ aralkyl. Representative alkyl groups include but are not limited to methyl, ethyl, propyl, isopropyl, butyl, isobutyl, sec-butyl, tert-butyl, pentyl, neopentyl, hexyl, heptyl, octyl, nonyl, decyl and dodecyl. Representative alkenyl groups include but are not limited to vinyl, propenyl, butenyl and hexenyl. Representative alkynyl groups include but are not limited to ethynyl, 1-propynyl, 2-propynyl, 1 butynyl, and 2-butynyl. Representative cycloalkyl groups include but are not limited to cyclopentyl, cyclohexyl, and cyclooctyl substituents. Representative aryl groups include but are not limited to phenyl, biphenyl, naphthyl, and anthracenyl. Representative aralkyl groups include but are not limited to benzyl, phenethyl and phenbutyl.

The term "halohydrocarbyl" as used herein is inclusive of the hydrocarbyl moieties mentioned above but where there is a degree of halogenation that can range from at least one hydrogen atom being replaced by a halogen atom (e.g., a fluoromethyl group) to where all hydrogen atoms on the hydrocarbyl group have been replaced by a halogen atom (e.g., trifluoromethyl or perfluoromethyl), also referred to as perhalogenation. For example, halogenated alkyl groups that can be useful in embodiments of the present invention can be partially or fully halogenated, alkyl groups of the formula $C_aX_{2a+1}$ wherein X is independently a halogen or a hydrogen and a is selected from an integer of 1 to 25. In some embodiments each X is independently selected from hydrogen, chlorine, fluorine bromine and/or iodine. In other embodiments each X is independently either hydrogen or fluorine. Thus, representative halohydrocarbyls and perhalocarbyls are exemplified by the aforementioned exemplary hydrocarbyls where an appropriate number of hydrogen atoms are each replaced with a halogen atom.

In addition, the definition of the terms "hydrocarbyl", "halohydrocarbyl", and "perhalohydrocarbyl", are inclusive of moieties where one or more of the carbons atoms is replaced by a heteroatom selected independently from O, N, P, or Si. Such heteroatom containing moieties can be referred to as, for example, either "heteroatom-hydrocarbyls" or "heterohydrocarbyls", including, among others, ethers, epoxies, glycidyl ethers, alcohols, carboxylic acids, esters, maleimides, amines, imines, amides, phenols, amidophenols, silanes, siloxanes, phosphines, phosphine oxides, phosphinites, phosphonites, phosphites, phosphonates, phosphinates, and phosphates.

Further exemplary hydrocarbyls, halohydrocarbyls, and perhalocarbyls, inclusive of heteroatoms, include, but are not limited to, —$(CH_2)_n$—Ar—$(CH_2)_n$—$C(CF_3)_2$—OH, —$(CH_2)_n$—Ar—$(CH_2)_n$—$OCH_2C(CF_3)_2$—OH, —$(CH_2)_n$—$C(CF_3)_2$—OH, —$((CH_2)_1$—O—$)_k$—$(CH_2)$—$C(CF_3)_2$—OH, —$(CH_2)_n$—$C(CF_3)(CH_3)$—OH, —$(CH_2)_n$—C(O)NHR*, —$(CH_2)_n$—C(O)Cl, —$(CH_2)_n$—C(O)OR*, —$(CH_2)_n$—OR*, —$(CH_2)_n$—OC(O)R* and —$(CH_2)_n$—C(O)R*, where n independently represents an integer from 0 to 12, i is 2, 3 or 4, k is 1, 2 or 3, Ar is aryl, for example phenyl, and R* independently represents hydrogen, a $C_1$-$C_{11}$ alkyl, a $C_1$-$C_{11}$ halogenated or perhalogenated alkyl, a $C_2$-$C_{10}$ alkenyl, a $C_2$-$C_{10}$ alkynyl, a $C_5$-$C_{12}$ cycloalkyl, a $C_6$-$C_{14}$ aryl, a $C_6$-$C_{14}$ halogenated or perhalogenated aryl, a $C_2$-$C_{14}$ aralkyl or a halogenated or perhalogenated $C_2$-$C_{14}$ aralkyl.

Exemplary perhalogenated alkyl groups include, but are not limited to, trifluoromethyl, trichloromethyl, —$C_2F_5$, —$C_3F_7$, —$C_4F_9$, —$C_6F_{13}$, —$C_7F_{15}$, and —$C_{11}F_{23}$. Exemplary halogenated or perhalogenated aryl and aralkyl groups include, but are not limited to, groups having the formula —$(CH_2)_x$—$C_6F_yH_{5-y}$, and —$(CH_2)_x$—$C_6F_yH_{4-y}$-p$C_zF_qH_{2z+1-q}$, where x, y, q and z are independently selected integers from 0 to 5, 0 to 5, 0 to 9 and 1 to 4, respectively, and "p" means "para". Specifically, such exemplary halogenated or perhalogenated aryl groups include, but are not limited to, pentachlorophenyl, pentafluorophenyl, pentafluorobenzyl, 4-trifluoromethylbenzyl, pentafluorophenethyl, pentafluorophenpropyl, and pentafluorophenbutyl.

In a preferred embodiment of the present invention, the norbornene-type polymer incorporates two or more distinct types of repeating units.

In another preferred embodiment of the present invention, the norbornene-type polymer incorporates one or more distinct types of repeating units, where at least one such type of repeating unit encompasses pendant crosslinkable groups or moieties that have some degree of latency. By "latency", it is meant that such groups do not crosslink at ambient conditions or during the initial forming of the polymers, but rather crosslink when such reactions are specifically initiated, for example by actinic radiation or heat. Such latent crosslinkable groups are incorporated into the polymer backbone by, for example, providing one or more norbornene-type monomers encompassing such a pendant crosslinkable group, for example a substituted or unsubstituted maleimide or maleimide containing pendant group, to the polymerization reaction mixture and causing the polymerization thereof. Preferred crosslinkable groups include a group comprising a substituted or unsubstituted maleimide portion, an epoxide portion, a vinyl portion, an acetylene portion, an indenyl portion, a cinnamate portion or a coumarin portion, and more specifically a group selected from a 3-monoalkyl- or 3,4-dialkylmaleimide, epoxy, vinyl, acetylene, cinnamate, indenyl or coumarin group.

In another preferred embodiment the norbornene-type polymer comprises one or more distinct types of repeating units of Formula I

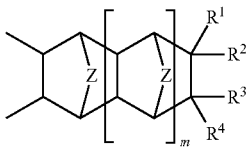
(I)

wherein Z is selected from —CH$_2$—, —CH$_2$—CH$_2$— or —O—, m is an integer from 0 to 5, each of R$^1$, R$^2$, R$^3$ and R$^4$ are independently selected from H, a C$_1$ to C$_{25}$ hydrocarbyl, a C$_1$ to C$_{25}$ halohydrocarbyl or a C$_1$ to C$_{25}$ perhalocarbyl group.

The repeating units of Formula I are formed from the corresponding norbornene-type monomers of Formula Ia where Z, m and R$^{1-4}$ are as defined above:

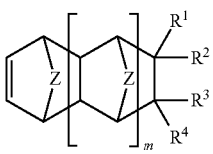
(Ia)

In the repeating units and monomers of Formula I and Ia, in a preferred embodiment Z is —CH$_2$— and m is 0, 1 or 2, in another preferred embodiment, Z is —CH$_2$— and m is 0 or 1, and in still another preferred embodiment, Z is —CH$_2$— and m is 0.

In another preferred embodiment the bank structures comprise a polymer composition which comprises either a single norbornene-type polymer or a blend of two or more different norbornene-type polymers. Where such polymer composition embodiments encompass a single norbornene-type polymer, such polymer can be a homopolymer, that is to say a polymer encompassing only one type of repeating unit, or a copolymer, that is to say a polymer encompassing two or more distinct types of repeating units. Where such polymer composition embodiments encompass a blend of different polymers, "different" is understood to mean that each of the blended polymers encompasses at least one type of repeating unit, or combination of repeating units, that is distinct from any of the other blended polymers.

In another preferred embodiment of the invention the polymer composition is a blend of two or more different norbornene-type polymers, wherein each polymer comprises one or more distinct types of repeating units of formula I

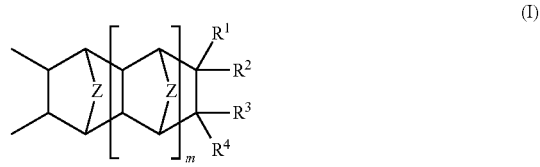
(I)

wherein Z is selected from —CH$_2$—, —CH$_2$—CH$_2$— or —O—, m is an integer from 0 to 5, each of Fe, R$^2$, R$^3$ and R$^4$ are independently selected from H, a C$_1$ to C$_{25}$ hydrocarbyl, a C$_1$ to C$_{25}$ halohydrocarbyl or a C$_1$ to C$_{25}$ perhalocarbyl group.

The polymer and polymer composition embodiments of the present invention can advantageously be tailored to provide a distinct set of properties for each of many specific applications. That is to say that different combinations of norbornene-type monomers with several different types of pendant groups can be polymerized to provide norbornene-type polymers having properties that provide for obtaining control over properties such as flexibility, adhesion, dielectric constant, and solubility in organic solvents, among others. For example, varying the length of an alkyl pendant group can allow control of the polymer's modulus and glass transition temperature (T$_g$). Also, pendant groups selected from maleimide, cinnamate, coumarin, anhydride, alcohol, ester, and epoxy functional groups can be used to promote crosslinking and to modify solubility characteristics. Polar functional groups, epoxy and triethoxysilyl groups can be used to provide adhesion to metals, silicon, and oxides in adjacent device layers. Fluorinated groups, for example, can be used to effectively modify surface energy, dielectric constant and influence the orthogonality of the solution with respect to other materials.

Thus, in further preferred embodiments of the present invention, in particular for such embodiments where only one of R$^{1-4}$ is different from H, one or more of R$^{1-4}$ denote a halogenated or perhalogenated aryl or aralkyl group including, but not limited to those of the formula —(CH$_2$)$_x$—C$_6$F$_y$H$_{5-y}$, and —(CH$_2$)$_x$—C$_6$F$_y$H$_{4-y}$-pC$_z$F$_q$H$_{2z+1-q}$, where x, y, q, and z are independently selected integers from 0 to 5, 0 to 5, 0 to 9, and 1 to 4, respectively, and "p" means "para". Specifically such formulae include, but are not limited to, trifluoromethyl, trichloromethyl, —C$_2$F$_5$, —C$_3$F$_7$, —C$_4$F$_9$, —C$_6$F$_{13}$, —C$_2$F$_{15}$, —C$_{11}$F$_{23}$, pentachlorophenyl, pentafluorophenyl, pentafluorobenzyl, 4-trifluoromethylbenzyl, pentafluorophenylethyl, pentafluorophenpropyl, and pentafluorophenbutyl.

Further still, some preferred embodiments of the present invention, in particular for such embodiments where only one of R$^{1-4}$ is different from H, encompass a group that is different from H that is a polar group having a terminal hydroxy, carboxy or oligoethyleneoxy moiety, for example a terminal hydroxyalkyl, alkylcarbonyloxy (for example, acetyl), hydroxy-oligoethyleneoxy, alkyloxy-oligoethyleneoxy or alkylcarbonyloxy-oligoethyleneoxy moiety, where "oligoethyleneoxy" is understood to mean —(CH$_2$CH$_2$O)$_s$— with s being 1, 2 or 3; for example 1-(bicyclo[2.2.1]hept-5-en-2-yl)-2,5,8,11-tetraoxadodecane (NB-TODD) where s is 3, and 5-((2-(2-methoxyethoxy)ethoxy)methyl)bicyclo[2.2.1]hept-2-ene (NBTON) where s is 2.

Further still, other preferred embodiments of the present invention, in particular for such embodiments where only one of R$^{1-4}$ is different from H, encompass a group that is different from H that is a group having a pendant silyl group, for example a silyl group represented by $(CH_2)_n$—$SiR^9{}_3$ where n is an integer from 0 to 12, and each $R^9$ independently represents halogen selected from the group consisting of chlorine, fluorine, bromine and iodine, linear or branched ($C_1$ to $C_{20}$)alkyl, linear or branched ($C_1$ to $C_{20}$)alkoxy, substituted or unsubstituted ($C_6$ to $C_{20}$)aryloxy, linear or branched ($C_1$ to $C_{20}$)alkyl carbonyloxy; linear or branched ($C_1$ to $C_{20}$) dialkylamido; substituted or unsubstituted ($C_6$-$C_{20}$) diarylamido; substituted or unsubstituted ($C_1$-$C_{20}$)alkylarylamido.

Yet further still, for such embodiments where only one of $R^{1-4}$ is different from H, preferred embodiments encompass a group that is either a photoreactive or a crosslinkable group. Preferred photoreactive or crosslinkable groups encompass a linking portion L and a functional portion F. Preferably L denotes or comprises a group selected from $C_1$-$C_{12}$ alkyls, aralkyls, aryls or hetero atom analogs. Further preferably functional portion F denotes or comprises one or more of a maleimide, a 3-monoalkyl- or 3,4-dialkylmaleimide, epoxy, vinyl, acetylenic, cinnamate, indenyl or coumarin moiety, which is capable of a crosslinking or 2+2 crosslinking reaction.

As used herein, the phrase "photoreactive and/or crosslinkable", when used to describe certain pendant groups, will be understood to mean a group that is reactive to actinic radiation and as a result of that reactivity enters into a crosslinking reaction, or a group that is not reactive to actinic radiation but can, in the presence of a crosslinking activator, enter into a crosslinking reaction.

Preferred repeating units that encompass a pendant photoreactive or crosslinkable group that are representative of Formula I are formed during polymerization from norbornene-type monomers that include, but are not limited to, those selected from the following formulae:

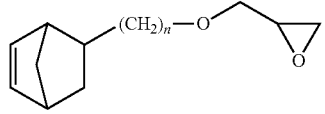

P1

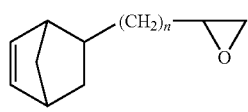

P2

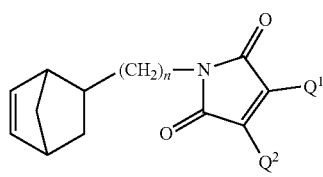

P3

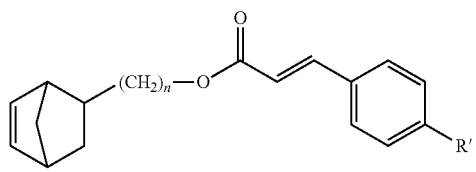

P4

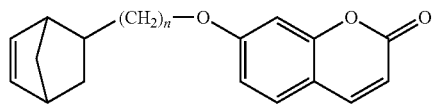

P5 wherein n is an integer from 1 to 8, $Q^1$ and $Q^2$ are each independently from one another —H or —$CH_3$, and R' is —H or —$OCH_3$.

Further preferred repeating units of Formula I such as described above are derived from one or more norbornene-type monomers represented by the following structural formulae (N-1) through (N-5) below:

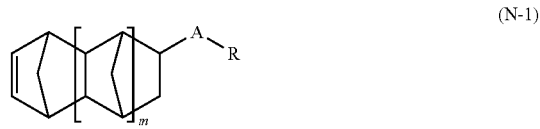

(N-1)

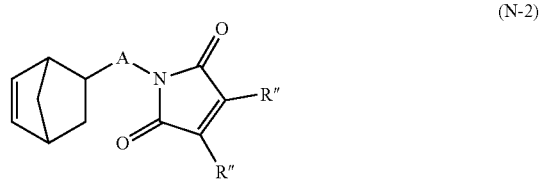

(N-2)

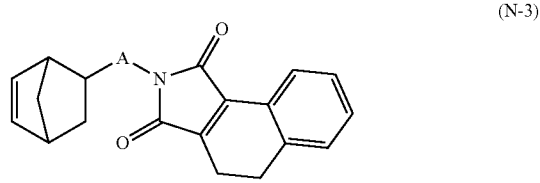

(N-3)

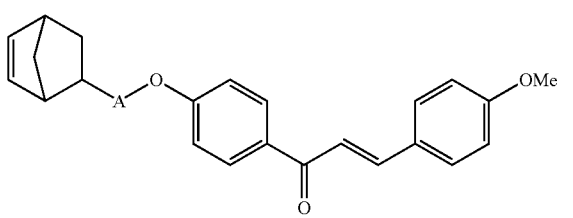

(N-4)

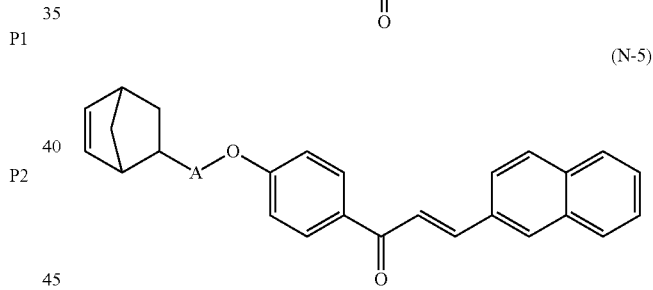

(N-5)

For structural formulae (N-1) to (N-5) above, m is an integer from 0 to 3, A is a connecting, spacer or bridging group selected from $(CZ_2)_n$, $(CH_2)_n$—$(CH=CH)_p$—$(CH_2)_n$, $(CH_2)_n$—O—$(CH_2)_n$, $(CH_2)_n$—$C_6Q_4$-$(CH_2)_n$, and for structure 1 additionally selected from $(CH_2)_n$—O and C(O)—O; R is selected from H, $CZ_3$, $(CZ_2)_nCZ_3$, OH, O—(O)CCH$_3$, $(CH_2CH_2O)_nCH_3$, $(CH_2)_n$—$C_6Q_5$, cinnamate or p-methoxy-cinnamate, coumarin, phenyl-3-indene, epoxide, C≡C—Si($C_2H_5$)$_3$ or C≡C—Si(i-$C_2H_5$)$_3$, each n is independently an integer from 0 to 12, p is an integer from 1-6, $C_6Q_4$ and $C_6Q_5$ denote benzene that is substituted with Q, Q is independently H, F, $CH_3$, $CF_3$ or $OCH_3$, Z is independently H or F, with the proviso that -A-R does not contain an —O—O— (peroxy) linkage, and R" is independently H or $CH_3$.

Further preferred repeating units of Formula I such as described above are formed by one or more norbornene-type monomers that include, but are not limited to, those selected from the group consisting of the following formulae:

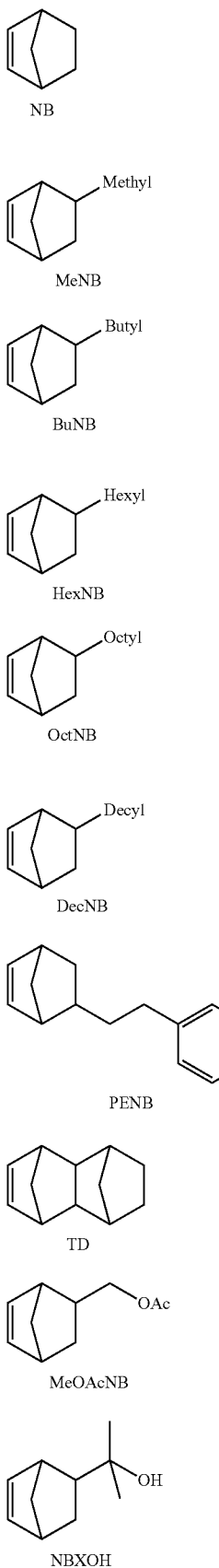
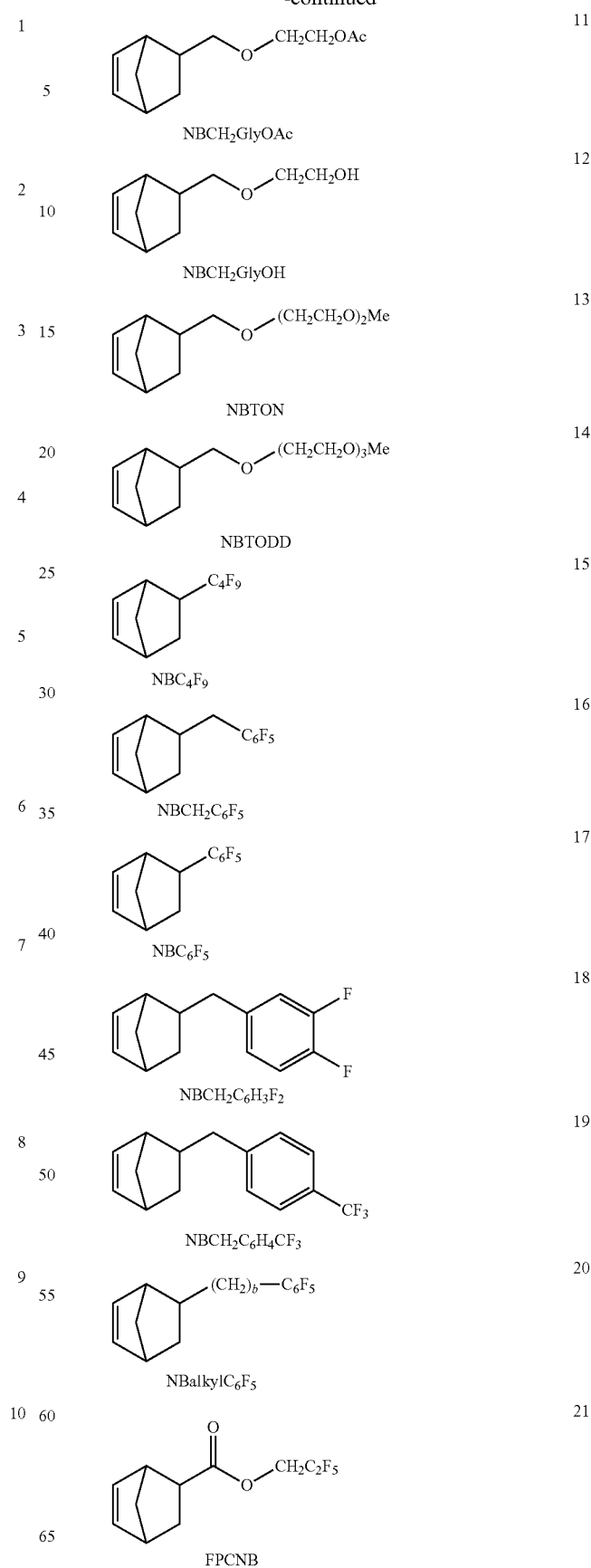

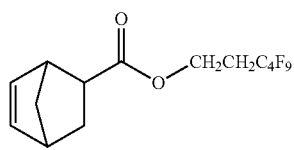
FHCNB
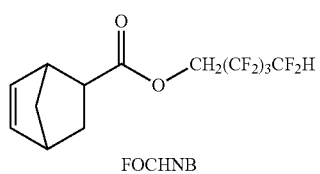
FOCHNB
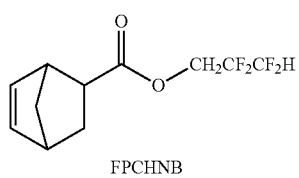
FPCHNB
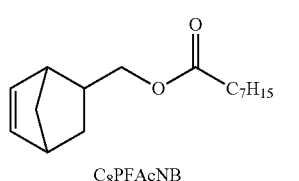
C8PFAcNB
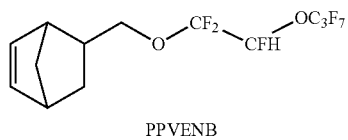
PPVENB
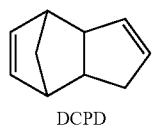
DCPD
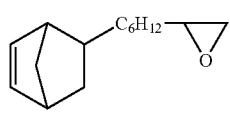
EONB
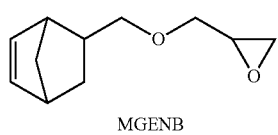
MGENB
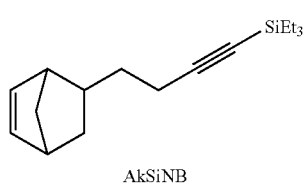
AkSiNB
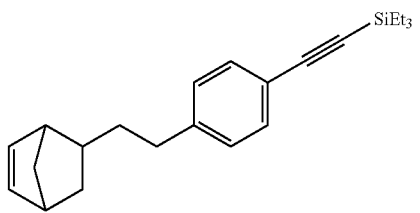
ArSiNB
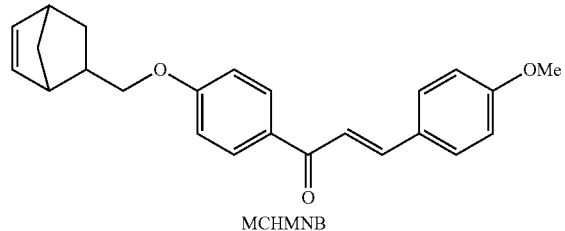
MCHMNB
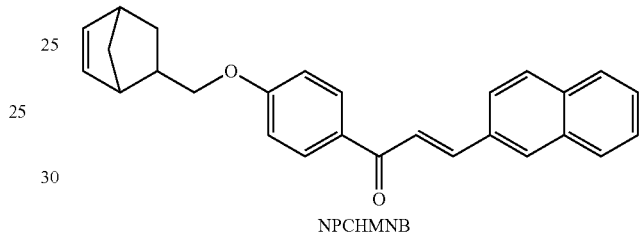
NPCHMNB
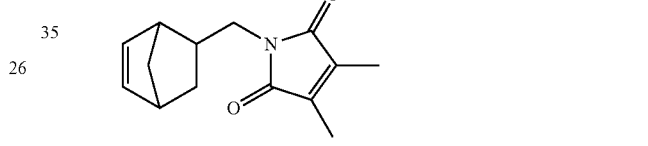
DMMIMeNB
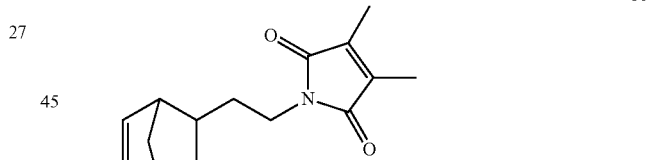
DMMIEtNB
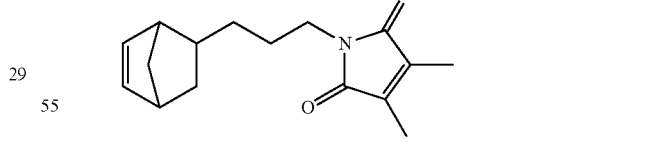
DMMIPrNB
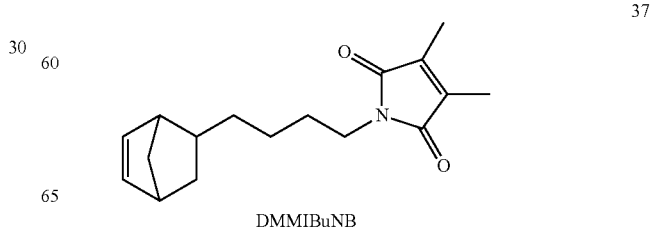
DMMIBuNB -continued
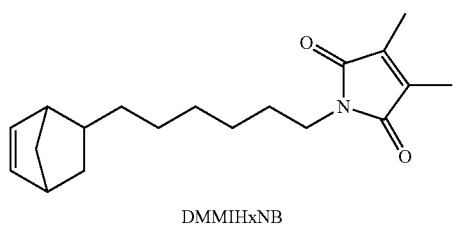
DMMIHxNB
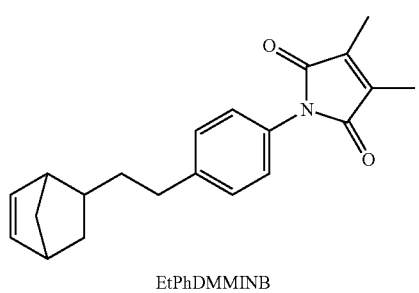
EtPhDMMINB
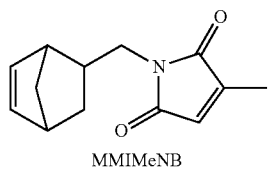
MMIMeNB
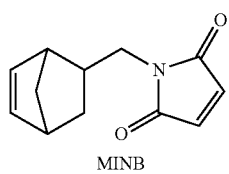
MINB
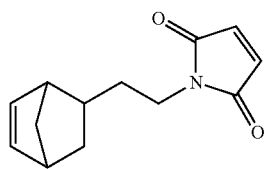
MIENB
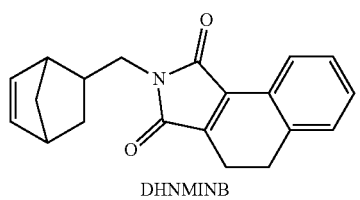
DHNMINB
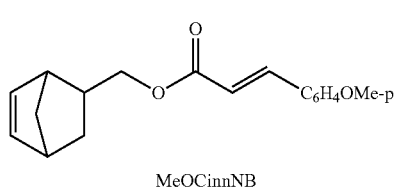
MeOCinnNB
-continued
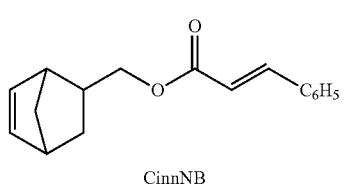
CinnNB
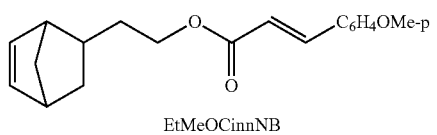
EtMeOCinnNB
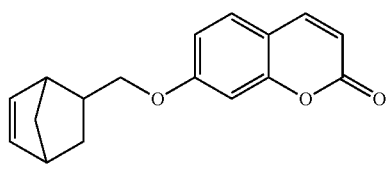
MeCoumNB
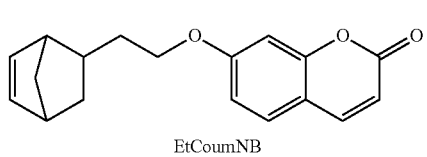
EtCoumNB
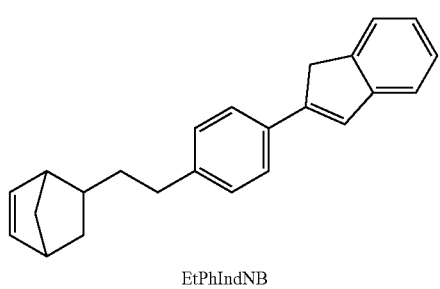
EtPhIndNB
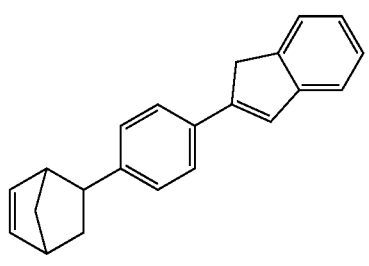
PhIndNB
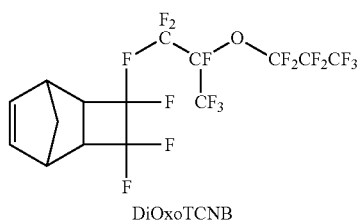
DiOxoTCNB

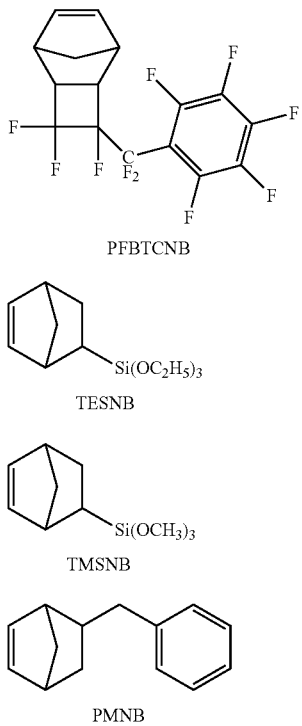

52 PFBTCNB

53 TESNB

54 TMSNB

55 PMNB where "Me" means methyl, "Et" means ethyl, "OMe-p" means para-methoxy, "Ph" and "C₆H₅" mean phenyl, "C₆H₄" means phenylene, "C₆F₅" means pentafluorophenyl, in subformulae 9 and 11 "OAc" means acetate, in subformula 25 "PFAc" means —OC(O)—C₂F₁₅, and for each of the above subformulae having a methylene bridging group (a CH₂ covalently bonded to both the norbornene ring and a functional group), including but not limited to subformulae 11-14, 16, 18, 19 and 55, it will be understood that the methylene bridging group can be replaced by a covalent bond or —(CH₂)$_b$— as in formula 20, and b is an integer from 1 to 6.

It will be further noted that while 55 specific examples are provided above, other monomers in accordance with embodiments of the present invention are inclusive of monomers represented by formula Ia where at least one of R¹, R², R³ and R⁴ are hydrocarbyls, halohydrocarbyls, and perhalocarbyls, inclusive of heteroatoms, that include, —(CH₂)$_n$—Ar—(CH₂)$_n$—C(CF₃)₂—OH, —(CH₂)$_n$—Ar—(CH₂)$_n$—OCH₂C(CF₃)₂—OH, —(CH₂)$_n$—C(CF₃)₂—OH, —((CH₂)$_n$—O—)$_k$—(CH₂)—C(CF₃)₂—OH, —(CH₂)$_n$—C(CF₃)(CH₃)—OH, (CH₂)$_n$—C(O)NHR*, (CH₂)$_n$—C(O)Cl, —(CH₂)$_n$—C(O)OR*, (CH₂)$_n$—OR*, —(CH₂)$_n$—OC(O)R* and —(CH₂)$_n$—C(O)R*, where n independently represents an integer from 0 to 12, i is 2, 3 or 4, k is 1, 2 or 3, Ar is aryl, for example phenyl, and R* independently represents hydrogen, a $C_1$-$C_{11}$ alkyl, a $C_1$-$C_{11}$ halogenated or perhalogenated alkyl, a $C_2$-$C_{10}$ alkenyl, a $C_2$-$C_{10}$ alkynyl, a $C_5$-$C_{12}$ cycloalkyl, a $C_6$-$C_{14}$ aryl, a $C_6$-$C_{14}$ halogenated or perhalogenated aryl, a $C_2$-$C_{14}$ aralkyl or a halogenated or perhalogenated $C_2$-$C_{14}$ aralkyl. Exemplary perhalogenated alkyl groups include, but are not limited to, trifluoromethyl, trichloromethyl, —C₂F₅, —C₃F₇, —C₄F₉, —C₇F₁₅, and —C₁₁F₂₃. Exemplary halogenated or perhalogenated aryl and aralkyl groups include, but are not limited groups having the formula —(CH₂)$_x$—C₆F$_y$H$_{5-y}$, and —(CH₂)$_x$—C₆F$_y$H$_{4-y}$-pC$_z$F$_q$H$_{2z+1-q}$, where x, y, q, and z are independently selected integers from 0 to 5, 0 to 5, 0 to 9, and 1 to 4, respectively. Specifically, such exemplary halogenated or perhalogenated aryl groups include, but are not limited to, pentachlorophenyl, pentafluorophenyl, pentafluorobenzyl, 4-trifluoromethylbenzyl, pentafluorophenylethyl, pentafluorophenpropyl, and pentafluorophenbutyl.

While Formula I and Ia, as well as each of the subformulae and generic formulae provided above are depicted without indication of any stereochemistry, it should be noted that generally each of the monomers, unless indicated otherwise, are obtained as diastereomeric mixtures that retain their configuration when converted into repeating units. As the exo- and endo-isomers of such diastereomeric mixtures can have slightly different properties, it should be further understood that preferred embodiments of the present invention are made to take advantage of such differences by using monomers that are either a mixture of isomers that is rich in either the exo- or endo-isomer, or are essentially the pure advantageous isomer.

Another preferred embodiment of the present invention is directed to polymers of Formula I that comprise repeating units where one of $R^{1-4}$, for example $R^1$, is a fluorinated or perfluorinated alkyl, aryl or aralkyl group as described above and the others of $R^{1-4}$ are H. Preferably, such repeating units are selected from the group consisting of above subformulae 15-26 (NBC₄F₉, NBCH₂C₆F₅, NBC₆F₅, NBCH₂C₆H₃F₂, NBCH₂C₆H₄CF₃, NBalkylC₆F₅, FPCNB, FHCNB, FOCHNB, FPCHNB, C₈PFAcNB, PPVENB). More preferably, such repeating units are selected from the group consisting of subformulae 16, 17, 18, 19, 20 or 26 (NBCH₂C₆F₅, NBC₆F₅, NBCH₂C₆H₃F₂, NBCH₂C₆H₄CF₃, NBalkylC₆F₅ or PPVENB).

Another preferred embodiment of the present invention is directed to polymers of Formula I that have repeating units where one of $R^{1-4}$, for example Fe, is a photoreactive or crosslinkable group as described above and the others of $R^{1-4}$ are H. Preferably, such repeating units are selected from one of the above subformulae 27-50. More preferably, such repeating units are selected from the group consisting of subformulae 34, 35, 36, 37 and 38 (DMMIMeNB, DMMIEtNB, DMMIPrNB, DMMIBuNB and DMMIHxNB). Most preferably, such repeating unit is of subformula 37 (DMMIBuNB).

Another preferred embodiment of the present invention is directed to polymers of Formula I that have repeating units where one of $R^{1-4}$, for example $R^1$, is a polar group having a hydroxy, carboxy, acetoxy or oligoethyleneoxy moiety as described above and the others of $R^{1-4}$ denote H. Preferably, such repeating units are selected from the group consisting of the above subformulae 9-14. More preferably such repeating unit is subformula 9 (MeOAcNB).

Another preferred embodiment of the present invention is directed to a polymer having a first type of repeating unit selected from fluorinated repeating units as described above and a second type of repeating unit selected from crosslinkable repeating units, also as described above. Preferred polymers of this embodiment include polymers having a first type of repeating unit selected from subformulae 15-26, more preferably 15, 16, 17, 18, 19, 20 and 26 (NBC₄F₉, NBCH₂C₆F₅, NBC₆F₅, NBCH₂C₆H₃F₂, NBCH₂C₆H₄CF₃, NBalkylC₆F₅, and PPVENB) and a second type of repeating unit selected from subformulae 34, 35, 36, 37 and 38 (DMMIMeNB, DMMIEtNB, DMMIPrNB, DMMIBuNB and DMMIHxNB).

Another preferred embodiment of the present invention is directed to a polymer having a first type of repeating unit selected from fluorinated repeating units as described above, a second type of repeating unit selected from crosslinkable repeating units, also as described above and a third type of repeating unit selected from polar repeating units, again as described above. Preferred polymers of this embodiment include polymers having a first repeating unit of subformula 9 (MeOAcNB), a second type of repeating unit selected from subformulae 34, 35, 36, 37, or 38 (DMMIMeNB, DMMIEtNB, DMMIPrNB, DMMIBuNB and DMMI-HxNB), and a third type of repeating unit selected from subformula 16 (NBCH$_2$C$_6$F$_5$).

Another preferred embodiment of the present invention is directed to a polymer having more than three different types of repeating units in accordance with Formula I. Another preferred embodiment of the present invention is directed to a polymer blend of a first polymer having a first type of repeating unit in accordance with Formula I, and a second polymer having, at least, a first type of repeating unit and a second type of repeating unit in accordance with Formula I that is distinct from the first type. Alternatively such polymer blends can encompass the aforementioned second polymer mixed with an alternative first polymer having two or more distinct types of repeat units in accordance with Formula I. Further preferably, such polymer blends can encompass the aforementioned alternative first polymer mixed with an alternative second polymer having three distinct types of repeat units in accordance with Formula I.

Another preferred embodiment of the present invention is directed to a polymer having a first and a second distinct type of repeat units in accordance with Formula I where the ratio of such first and second type of repeat units is from 95:5 to 5:95. In another preferred embodiment the ratio of such first and second type of repeat units is from 80:20 to 20:80. In still another preferred embodiment the ratio of such first and second type of repeat units is from 60:40 to 40:60. In yet another preferred embodiment the ratio of such first and second type of repeat units is from 55:45 to 45:55.

Examples of suitable and preferred norbornene monomers, polymers and methods for their synthesis are provided herein and can also be found in U.S. Pat. No. 5,468,819, U.S. Pat. No. 6,538,087, US 2006/0020068 A1, US 2007/0066775 A1, US 2008/0194740 A1, PCT/EP2011/004281, U.S. Ser. No. 13/223,784, PCT/EP2011/004282 and U.S. Ser. No. 13/223,884, which are incorporated into this application by reference. For example, exemplary polymerizations processes employing Group VIII transition metal catalysts are described in the aforementioned US 2006/0020068 A1.

The polymer embodiments of the present invention are formed having a weight average molecular weight ($M_w$) that is appropriate to their use. Generally, a $M_w$ from 5,000 to 500,000 is found appropriate for some embodiments, while for other embodiments other $M_w$ ranges can be advantageous. For example, in a preferred embodiment, the polymer has a $M_w$ of at least 30,000, while in another preferred embodiment the polymer has a $M_w$ of at least 60,000. In another preferred embodiment, the upper limit of the polymer's $M_w$ is up to 400,000, while in another preferred embodiment the upper limit of the polymer's $M_w$ is up to 250,000. It will be understood that since an appropriate $M_w$ is a function of the desired physical properties in the cured polymer, films, layers or structures derived therefrom, it is a design choice and thus any $M_w$ within the ranges provided above is within the scope of the present invention.

In a preferred embodiment of the present invention, a crosslinkable or crosslinked polycycloolefinic polymer is used as bank structure material or as a component thereof. It has been found that such a crosslinkable or crosslinked polymer can serve to improve one or more properties selected from structural integrity, durability, mechanical resistivity and solvent resistivity of the gate dielectric layer and the electronic device. Very suitable and preferred crosslinkable polymers are for example those having one or more repeating units of Formula I wherein one or more of $R^{1-4}$ denotes a crosslinkable group, very preferably units formed by monomers selected from any one of subformulae 27-50.

For crosslinking, the polymer, generally after deposition thereof, is exposed to electron beam or electromagnetic (actinic) radiation such as X-ray, UV or visible radiation, or heated if it contains thermally crosslinkable groups. For example, actinic radiation may be employed to image the polymer using a wavelength of from 11 nm to 700 nm, such as from 200 to 700 nm. A dose of actinic radiation for exposure is generally from 25 to 15000 mJ/cm$^2$. Suitable radiation sources include mercury, mercury/xenon, mercury/halogen and xenon lamps, argon or xenon laser sources, x-ray. Such exposure to actinic radiation is to cause crosslinking in exposed regions. Although other repeating unit pendant groups that crosslink can be provided, generally such crosslinking is provided by repeating units that encompass a maleimide pendant group, that is to say one of $R^1$ to $R^4$ is a substituted or unsubstituted maleimide moiety. If it is desired to use a light source having a wavelength outside of the photo-absorption band of the maleimide group, a radiation sensitive photosensitizer can be added. If the polymer contains thermally crosslinkable groups, optionally an initiator may be added to initiate the crosslinking reaction, for example in case the crosslinking reaction is not initiated thermally. Exemplary conditions for crosslinking are UV irradiation with a wavelength of 365 nm at a dose of 88 mJ.

In a preferred embodiment, the bank structures are post exposure baked at a temperature from 70° C. to 130° C., for example for a period of from 30 s to 10 min. Post exposure bake can be used to further promote crosslinking of crosslinkable moieties within exposed portions of the polymer.

In another preferred embodiment, the crosslinkable polymer composition comprises a stabilizer material or moiety to prevent spontaneous crosslinking and improve shelf life of the polymer composition. Suitable stabilizers are antioxidants such as catechol or phenol derivatives that optionally contain one or more bulky alkyl groups, for example t-butyl groups, in ortho-position to the phenolic OH group.

In order to improve the processing of the individual device components, including functional layers and bank structures, and the integrity of the electronic device, it is desirable to decrease the time needed for the process while keeping or improving the physical properties of the components being formed. This can be maintained where subsequent components and solvents used in forming such components are orthogonal and thus do not dissolve each other. Where such orthogonality is difficult to obtain, crosslinking, typically UV crosslinking, a first component to make such first component insoluble with respect to the polymer composition of a second component will prevent any influence of the properties of either component on the other component.

Shortening the time needed for the processing can be done for example by tuning the coating process, while decreasing the time needed for UV crosslinking can be achieved both by chemical adjustment of the polymer or by changes in the process.

However, chemical modifications of polymers are limited, because the UV sensitivity is related to certain properties of the polymer, and for example changes towards increased UV sensitivity may decrease the solubility. Changing the process, for example, by using higher power UV, could increase the possibility of creating an ozone atmosphere and thus cause undesired changes in the surface of the polymer dielectric.

Therefore, in a preferred embodiment of the present invention the polymer composition comprises one or more crosslinker additives. Such additives comprise two or more functional groups that are capable of reacting with the pendant crosslinkable groups of the polycycloolefinic polymer used to form the bank structure. It will also be understood that the use of such crosslinker additives can also enhance the crosslinking of the aforementioned polymer.

Crosslinking by exposure to UV radiation is preferred.

The crosslinkable group of the crosslinker is preferably selected from a maleimide, a 3-monoalkyl-maleimide, a 3,4-dialkylmaleimide, an epoxy, a vinyl, an acetylene, an indenyl, a cinnamate or a coumarin group, or a group that comprises a substituted or unsubstituted maleimide portion, an epoxide portion, a vinyl portion, an acetylene portion, an indenyl portion, a cinnamate portion or a coumarin portion.

Very preferably the crosslinker is selected of formula III1 or III2

P-A"X'T-A"-P                    III1

H$_{4-c}$C(A"-P)$_c$              III2 wherein X' is O, S, NH or a single bond, A" is a single bond or a connecting, spacer or bridging group, which is selected from (CZ$_2$)$_n$, (CH$_2$)$_n$—(CH=CH)$_p$—(CH$_2$)$_n$, (CH$_2$)$_n$—O—(CH$_2$)$_n$, (CH$_2$)$_n$—C$_6$Q$_{10}$-(CH$_2$)$_n$, and C(O), where each n is independently an integer from 0 to 12, p is an integer from 1-6, Z is independently H or F, C$_6$Q$_{10}$ is cyclohexyl that is substituted with Q, Q is independently H, F, CH$_3$, CF$_3$, or OCH$_3$, P is a crosslinkable group, and c is 2, 3, or 4, and where in formula III1 at least one of X' and the two groups A" is not a single bond.

P is preferably selected from a maleimide, a 3-monoalkyl-maleimide, a 3,4-dialkylmaleimide, an epoxy, a vinyl, an acetylene, an indenyl, a cinnamate or a coumarin group, or comprises a substituted or unsubstituted maleimide portion, an epoxide portion, a vinyl portion, an acetylene portion, an indenyl portion, a cinnamate portion or a coumarin portion.

Suitable and preferred compounds of formula III1 are selected from formula Cl:

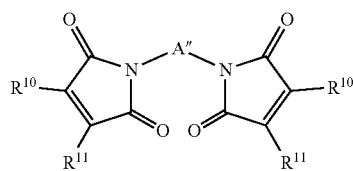

C1 wherein $R^{10}$ and $R^{11}$ are independently of each other H or a $C_1$-$C_6$ alkyl group, and A" is as defined in formula III1. In one preferred embodiment of this invention, the crosslinkers are selected from DMMI-butyl-DMMI, DMMI-pentyl-DMMI and DMMI-hexyl-DMMI, wherein "DMMI" means 3,4-dimethylmaleimide.

The spacer group A" preferably denotes linear $C_1$ to $C_{30}$ alkylene or branched $C_3$ to $C_{30}$ alkylene or cyclic $C_5$ to $C_{30}$ alkylene, each of which is unsubstituted or mono- or poly-substituted by F, Cl, Br, I or CN, wherein optionally one or more non-adjacent CH$_2$ groups are replaced, in each case independently from one another, by —O—, —S—, —NH—, —NR$^{18}$—, —SiR$^{18}$R$^{19}$—, —C(O)—, —C(O)O—, —OC(O)—, —OC(O)—O—, —S—C(O)—, —C(O)—S—, —CH=CH— or —C≡C— in such a manner that O and/or S atoms are not linked directly to one another, $R^{18}$ and $R^{19}$ are independently of each other H, methyl, ethyl or a $C_3$ to $C_{12}$ linear or branched alkyl group.

Preferred groups A" are —(CH$_2$)$_r$—, —(CH$_2$CH$_2$O)$_s$—CH$_2$CH$_2$—, —CH$_2$CH$_2$—S—CH$_2$CH$_2$— or —CH$_2$CH$_2$—NH—CH$_2$CH$_2$— or —(SiR$^{18}$R$^{19}$-0)$_c$—, with r being an integer from 2 to 12, s being 1, 2 or 3 and $R^{18}$ and $R^{19}$ having the meanings given above.

Further preferred groups A" are selected from methylene, ethylene, propylene, butylene, pentylene, hexylene, heptylene, octylene, nonylene, decylene, undecylene, dodecylene, octadecylene, ethyleneoxyethylene, methyleneoxybutylene, ethylene-thioethylene, ethylene-N-methyl-iminoethylene, 1-methylalkylene, ethenylene, propenylene and butenylene.

The synthesis of crosslinkers like those of formula Cl is disclosed for example in U.S. Pat. No. 3,622,321.

In another preferred embodiment the polymer composition comprises a crosslinkable polycycloolefinic polymer and a reactive adhesion promoter. The reactive adhesion promoter comprises a first functional group which is a surface-active group that is capable of interactions, for example chemical bonding, with the substrate on which the bank structures are provided, and a second functional group that is capable of interactions, either with or without forming a chemical bond, with the polycycloolefinic polymer, for example by crosslinking with a pendant crosslinkable group in the polycycloolefinic polymer. The adhesion promoter may be used especially if a photolithography process is employed when providing the bank structures or further functional layers.

Preferably the adhesion promoter is a compound of formula IV

G$^1$-A"-G$^2$                    IV wherein G$^1$ is a surface-active group, preferably a silane or silazane group, A" is a single bond or a connecting, spacer or bridging group, preferably as defined in formula III1 above, and G$^2$ is a crosslinkable group, preferably as defined in formula III1 above, or G$^2$ is a non-reactive compatibilizing group for the polycycloolefinic polymer. As used herein, the term "compatibilizing" will be understood to mean an interfacial agent or group that facilitates the formation of uniform blends of normally immiscible polymers. For example, if the polycycloolefinic polymer comprises a halogenated or perhalogenated portion, like for example in monomers 15 to 26, the compatibilizing group G$^2$ may be selected from a halogenated or perhalogenated alkyl, aryl or aralkyl group.

G$^1$ is preferably a group of the formula —SiR$^{12}$R$^{13}$R$^{14}$, or a group of the formula —NH—SiR$^{12}$R$^{13}$R$^{14}$, wherein R$^{12}$, R$^{13}$ and R$^{14}$ are each independently selected from halogen, silazane, $C_1$-$C_{12}$-alkoxy, $C_1$-$C_{12}$-alkylamino, optionally substituted $C_5$-$C_{20}$-aryloxy and optionally substituted $C_2$-$C_{20}$-heteroaryloxy, and wherein one or two of R$^{12}$, R$^{13}$ and R$^{14}$ may also denote $C_1$-$C_{12}$-alkyl, optionally substituted $C_5$-$C_{20}$-aryl or optionally substituted $C_2$-$C_{20}$-heteroaryl.

G$^2$ is preferably a crosslinkable group selected from a maleimide, a 3-monoalkyl-maleimide, a 3,4-dialkylmaleimide, an epoxy, a vinyl, an acetyl, an indenyl, a cinnamate or a coumarin group, or comprises a substituted or unsubstituted maleimide portion, an epoxide portion, a vinyl portion, an acetyl portion, an indenyl portion, a cinnamate portion or a coumarin portion.

In another preferred embodiment, $G^2$ is a non-reactive, compatibilizing group selected from a $C_1$-$C_{11}$ halogenated or perhalogenated alkyl, a $C_6$-$C_{14}$ halogenated or perhalogenated aryl, or a halogenated or perhalogenated $C_7$-$C_{14}$ aralkyl, more preferably from a $C_1$-$C_{11}$ alkyl, a $C_6$-$C_{14}$ aryl or a $C_7$-$C_{14}$ aralkyl each of which is fluorinated or perfluorinated, most preferably from —$C_4F_9$, —$(CH_2)_b$—$C_6F_5$, —$CH_2C_6F_2$, —$CH_2$—$C_2F_5$, —$CH_2CH_2$—$C_4F_9$, —$CH_2$—$(CF_2)_3$—$CF_2H$, —$CH_2CF_2CF_2H$, —$C_7F_{15}$ or —$CF_2CFHOC_3F_7$, wherein b is an integer from 1 to 6.

A" is preferably selected from $(CZ_2)_n$, $(CH_2)_n$—$(CH=CH)_p$—$(CH_2)_n$, $(CH_2)_n$—O, $(CH_2)_n$—O—$(CH_2)_n$, $(CH_2)_n$—$C_6Q_4$-$(CH_2)_n$, $(CH_2)_n$—$C_6Q_{10}$-$(CH_2)_n$ and C(O)—O, where each n is independently an integer from 0 to 12, p is an integer from 1-6, Z is independently H or F, $C_6Q_4$ is phenyl that is substituted with O. $C_6Q_{10}$ is cyclohexyl that is substituted with Q, Q is independently H, F, $CH_3$, $CF_3$ or $OCH_3$.

Suitable and preferred compounds of formula IV are selected from formula A1:

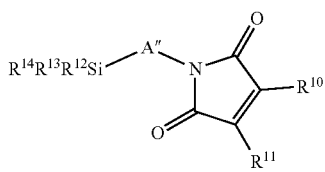

A1 where $R^{12}$, $R^{13}R^{14}$, and A" are as defined above, and $R^{10}$ and $R^{11}$ are each independently H or a $C_1$-$C_6$ alkyl group. Especially preferred are DMMI-propyl-Si(OEt)$_3$, DMMI-butyl-Si(OEt)$_3$, DMMI-butyl-Si(OMe)$_3$, DMMI-hexyl-Si (OMe)$_3$, wherein "DMMI" means 3,4-dimethylmaleimide.

Production Process

The present application also provides for a process for preparing an electronic device as defined earlier in this application.

Thus, in a general aspect the present application provides for a process for preparing an electronic device, wherein a layer is selectively swelled with a swelling solvent, thereby forming bank structures, which define a well.

In a more specific aspect, said process comprises the following steps:
a) depositing a material comprising a polycycloolefinic polymer on a substrate to form a layer; and
b) selectively swelling said layer with a swelling solvent, thereby forming bank structures, which define a well.

In another more specific aspect, the present application provides for a process which comprises the following steps:
a') depositing a material comprising a polycycloolefinic polymer on a substrate to form a layer;
b') exposing a part of the surface of said layer to actinic radiation; and
c') selectively swelling said layer with a swelling solvent, thereby forming bank structures, which define a well.

In a first alternative the present application preferably provides for a process for preparing a bottom gate electronic device as for example illustrated in FIG. 1.

Preferably such a process for preparing an electronic device comprises the following steps:
I-a) providing a substrate (1);
I-b) forming a gate electrode (2) on said substrate (1);
I-c) depositing a dielectric material comprising a polycycloolefinic polymer on said gate electrode (2) and said substrate (1) to form a dielectric layer (3);
I-d) forming source and drain electrodes (5) on said dielectric layer (3), such that said source and drain electrodes (5) are spaced apart with a channel region (6) located between said source and drain electrodes (5);
I-e) exposing a part of the surface of said dielectric layer (3) to actinic radiation such that the exposed part extends at least over the channel region (6);
I-f) subsequently swelling said dielectric layer (3) with a swelling solvent, thereby forming bank structures (8a, 8b), which define a well that extends at least over the channel region; and
I-g) depositing a layer of semiconductor material (7) in said well defined by said bank structures (8a, 8b).

Another such preferred process for preparing an electronic device comprises the following steps:
II-a) providing a substrate (1);
II-b) forming a gate electrode (2) on said substrate (1);
II-c) depositing a dielectric material comprising a polycycloolefinic polymer on said gate electrode (2) and said substrate (1) to form a dielectric layer (3);
II-d) exposing a part of the surface of said dielectric layer (3) to actinic radiation;
II-e) subsequently swelling said dielectric layer (3) with a swelling solvent, thereby forming bank structures (8a, 8b), which define a well;
II-f) forming source and drain electrodes (5) in the well on said dielectric layer (3), such that said source and drain electrodes (5) are spaced apart with a channel region (6) located between said source and drain electrodes (5);
II-g) depositing a layer of semiconductor material (7) in said well defined by said bank structures (8a, 8b).

Alternatively the present application preferably provides for a process for preparing a top gate electronic device as for example illustrated in FIG. 2.

Such a process for preparing an electronic device comprises the following steps
III-a) providing a substrate (1');
III-b) depositing a dielectric material comprising a polycycloolefinic polymer on said substrate (1') to form a planarization layer (4');
III-c) forming source and drain electrodes (5') on said planarization layer (4') such that said source and drain electrodes (5') are spaced apart with a channel region (6') located between said source and drain electrodes (5');
III-d) exposing a part of the surface of said planarization layer (4') to actinic radiation such that the exposed part extends at least over the channel region (6');
III-e) subsequently swelling said planarization layer (4') in a swelling solvent, thereby forming bank structures (8a', 8b'), which define a well that extends at least over the channel region (6');
III-f) depositing a layer of semiconductor material (7') in the well defined by said bank structures (8a', 8b');
III-g) subsequently depositing a further dielectric material to form a gate insulator layer (10'); and
III-h) forming a gate electrode (2') on said gate insulator layer (10').

Another such alternative preferred process for preparing an electronic device comprises the following steps:
IV-a) providing a substrate (1');
IV-b) depositing a dielectric material comprising a polycycloolefinic polymer on said substrate (1') to form a planarization layer (4');

IV-c) exposing a part of the surface of said planarization layer (4') to actinic radiation;

IV-d) subsequently swelling said planarization layer (4') in a swelling solvent, thereby forming bank structures (8a', 8b'), which define a well;

IV-e) forming source and drain electrodes (5') on said planarization layer (4') such that said source and drain electrodes are spaced apart with a channel region (6') located between said source and drain electrodes (5');

IV-f) depositing a layer of semiconductor material (7') in the well defined by said bank structures (8a', 8b');

IV-g) subsequently depositing a further dielectric material to form a gate insulator material (10'); and IV-h) forming a gate electrode (2') on said gate insulator layer (10').

Preferably, in steps II-f and IV-e the source and drain electrodes are positioned in the well using alignment markers.

Substrate, gate electrode, source and drain electrodes, dielectric layer, planarization layer, semiconductor layer and gate insulator layer are as defined previously in this application and are produced as indicated earlier in this application.

In steps I-e, II-d and III-d the dielectric layer and the planarization layer, respectively, are exposed to actinic radiation as described earlier in this application. The part that is exposed extends at least over the channel region. Preferably, the exposed part or the resulting well or both extend at least over the channel region and at least part of either the source or the drain electrode or both. Most preferably, the exposed part and the well extend at least over the channel region and the entire source and drain electrodes. Actinic radiation will result in a crosslinking of the dielectric layer and the planarization layer respectively in the exposed areas.

Following the exposure to actinic radiation, the dielectric layer or the planarization layer are swelled in a swelling solvent. The term "swelling solvent" is used to denote a solvent that is capable of swelling the dielectric layer or the planarization layer in the area that was not exposed to actinic radiation. It is noted that the swelling solvent is preferably selected such that it is a liquid under the conditions of use. However, the swelling solvent may also be a gas, provided that it is capable of swelling the dielectric or the planarization layer. The term "swelling" is used to denote an increase in the thickness that is due to the influence of the swelling solvent.

Preferably, said swelling solvent is an organic compound comprising a chemical group selected from the group consisting of —O—, —OH, —C(=O)—, —C(=O)O— and —COOH. More preferably, said swelling solvent is an organic compound comprising a chemical group selected from —OH and —C(=O)O—. Even more preferably, said swelling solvent is an organic compound comprising both, —OH and —C(=O)O—. Still even more preferably, the swelling solvent is of formula HO—$(CR^xR^y—)_s$COOR$^z$, wherein $R^x$ and $R^y$ are independently from one another selected from hydrogen and alkyl groups having from 1 to 10 carbon atoms and s is 1, 2 or 3. Most preferably the swelling solvent is ethyl lactate ($H_5C_2$—O—C(=O)—C(OH)—$CH_3$).

Examples of suitable swelling solvents include but are not limited to ethers ($R^x$—O—$R^y$), aldehydes ($R^x$—C(=O)H), alcohols ($R^x$—OH), ketones ($R^x$—C(=O)—$R^y$), carboxylic acids ($R^x$—C(=O)OH), carboxylic acid esters ($R^x$—C(=O)O—$R^y$), hydroxy acids (HO—$(CR^xR^y—)_s$COOH), and hydroxy acid esters (HO—$(CR^xR^y—)_s$COOR$^z$), wherein $R^x$ and $R^y$ are independently from one another hydrogen or an alkyl group having from 1 to 10 carbon atoms, provided that either $R^x$ or $R^y$ is different from hydrogen. Said alkyl group may be linear or branched. It may also be such that a hydrogen is replaced by a chemical group such as for example —OH.

Examples of alkyls having from 1 to 10 carbon atoms are methyl, ethyl, n-propyl, iso-propyl, n-butyl, iso-propyl, n-butyl, iso-butyl, sec-butyl, tert-butyl, pentyl, hexyl, heptyl, octyl, nonyl or decyl. Of these methyl, ethyl, n-propyl, iso-propyl, n-butyl, iso-propyl, n-butyl, iso-butyl, sec-butyl, tert-butyl are preferred.

Preferred examples of ethers are dimethylether, ethylmethylether, diethylether, ethylbutylether, diisopropylether and dibutylether. More preferred examples of ethers are dimethylether, ethylmethylether, and diethylether. Most preferred example of an ether is diethylether.

Preferred examples of aldehydes are formaldehyde, acetaldehyde, propanal, butanal, pentanal, hexanal, heptanal, octanal, nonanal and decanal. More preferred examples are formaldehyde, acetaldehyde, propanal and butanal. Most preferred examples are formaldehyde and acetaldehyde.

Preferred examples of alcohols are methanol, ethanol, n-propanol, iso-propanol, 1-butanol, 2-butanol, 2-methyl-1-propanol, 1-pentanol, 2-pentanol, 3-pentanol, 2-methyl-1-butanol, 2-methyl-2-butanol, 3-methyl-1-butanol and 3-methyl-2-butanol. Most preferred alcohols are methanol, ethanol, propanol and iso-propanol.

Preferred examples of ketones are acetone, 2-butanone (ethylmethylketone), 2-pentanone, 3-pentanone, 2-hexanone, 3-hexanone, 4-hexanone, 2-octanone, 3-octanone and 4-octanone. The most preferred example of a ketone is acetone.

Preferred examples of carboxylic acids are formic acid, acetic acid, propionic acid, butyric acid, 2-methylpropionic acid (isobutyric acid), valeric acid, 2-methlbutyric acid and 3-methylbutyric acid (isovaleric acid).

Preferred examples of carboxylic acid esters are methyl, ethyl, propyl and butyl esters of the above mentioned carboxylic acids such as for example methyl acetate, ethyl acetate, propyl acetate or butyl acetate.

Preferred examples of hydroxy acids are glycolic acid (HO—$CH_2$—COOH), lactic acid ($H_3$C—CH(OH)—COOH), malic acid (HOOC—$CH_2$—CH(OH)—COOH), citric acid and tartaric acid (HOOC—CH(OH)—CH(OH)—COOH). The most preferred example of a hydroxy acid is lactic acid.

Preferred examples of hydroxy acid esters are methyl, ethyl, propyl and butyl esters of the above mentioned hydroxy acids. The most preferred example of a hydroxy acid ester is ethyl lactate ($H_5C_2$—O—C(=O)—C(OH)—$CH_3$).

Following the swelling step the present process preferably comprises a post-swelling annealing step, wherein the bank structures are annealed at a post-swelling annealing temperature of at least 60° C. and of at most 140° C. for a time from 1 s to 10 min. Said post-swelling annealing temperature preferably is at least 60° C., more preferably at least 80° C. and most preferably at least 90° C. Said post-swelling annealing temperature preferably is at most 130° C., more preferably at most 120° C., and most preferably at most 110° C. Preferably the time, during which the post-swelling annealing is done, is at least 5 s, more preferably at least 10 s, even more preferably at least 15 s, and most preferably at least 20 s. Preferably the time, during which the post-swelling annealing is done, is at most 8 min, more preferably at most 6 min, even more preferably at most 4 min, still even more preferably at most 3 min, and most preferably at most 2 min.

Preferably, following the swelling step or—if present—the post-swelling annealing step the bank structures can be further crosslinked as described above.

Preferably, before the step of depositing a layer of semiconducting material, i.e. before step I-g, II-g, III-f or IV-f, the present process further comprises the step of performing a surface treatment by depositing a self-assembled monolayer of a material that changes the surface energy of the bank structures, the dielectric layer or the planarization layer, respectively. This surface treatment can for example be performed with surface treatment formulation Lisicon M001® (Merck KGaA, Darmstadt, Germany).

It has been found that the present invention allows for time-material- and cost-efficient production of electronic devices comprising bank structures. Particularly, the present invention allows for efficient production of such electronic devices by eliminating the need to form bank structures by additive processing, such as for example by printing the bank structures from a polymer solution using printing technologies like ink-jet printing, flexographic printing or gravure printing, followed by solvent removal and an optional curing of the polymer, such as for example by UV exposure.

The present inventors have found that the present invention permits the formation of bank structures without the need to apply said bank structures as a separate layer of material. First experiments have very surprisingly shown that the present process allows the production of electronic devices with very small channel lengths, for example with channel lengths on the order of 10 µm, and at the same time with good device properties.

Thus, the present application also relates to a bank structure obtained by the process of the present invention. Furthermore, it relates to a bank structure comprising a polycycloolefinic polymer as defined earlier in this application, wherein the bank structure comprises a swelling solvent as defined earlier in this application.

In addition, the present application relates to an organic electronic device obtained by the process of the present invention.

Furthermore, the present application relates to a product or assembly comprising an organic electronic device as defined above, said product or assembly being selected from the group consisting of Integrated Circuit, Radio Frequency Identification tag, security marking or security device containing a Radio Frequency Identification tag, Flat Panel Display, backplane of an FPD, backlight of a Flat Panel Display, electrophotographic device, electrophotographic recording device, organic memory device, sensor, biosensor and biochip.

It will be appreciated that variations to the foregoing embodiments of the invention can be made while still falling within the scope of the invention. Each feature disclosed in this specification, unless stated otherwise may be replaced by alternative features serving the same, equivalent or similar purpose. Thus, unless stated otherwise, each feature disclosed is one example only of a generic series of equivalent or similar features.

All of the features disclosed in this specification may be combined in any combination, except combinations where at least some of such features and/or steps are mutually exclusive. In particular, the features of the invention are still applicable to all aspects of the invention and may be used in any combination. Likewise, features described in non-essential combinations may be used separately (not in combination).

The invention will now be described in more detail by reference to the following example, which is illustrative only and does not limit the scope of the invention.

EXAMPLES

Dielectric material D207 was deposited as a planarization layer onto a glass substrate, followed by evaporation of silver onto the planarization layer to form the source and drain electrodes, Subsequently, rectangular regions of the planarizing layer encompassing the source and drain electrodes as well as the channel region between source and drain electrodes were exposed to UV irradiation at a wavelength of 365 nm at a dose of 88 mJ. The exposed planarization layer was then treated with ethyl lactate for 60 to 70 s, leading to the formation of bank structures in the regions of the planarization layer not exposed to the UV irradiation. The bank structure material can be fully crosslinked at this point by applying a further UV dose of 0.6 J. The surface was then treated with surface treatment formulation M001® for 1 min, washed with iso-propanol and dried by spin off on the spin coater. Next, organic semiconductor formulation S1200® was spun onto the substrate and annealed for 1 min at 100° C. on a hotplate. Finally, material D139® was spun onto the layer of semiconductor material and the gate electrode is formed by evaporating silver onto the layer of semiconductor material.

FIG. 3 shows an exemplary schematic view of a part of such resulting electronic device, wherein the layer of semiconductor material is confined within a well defined by the bank structures (8).

Figure 4:
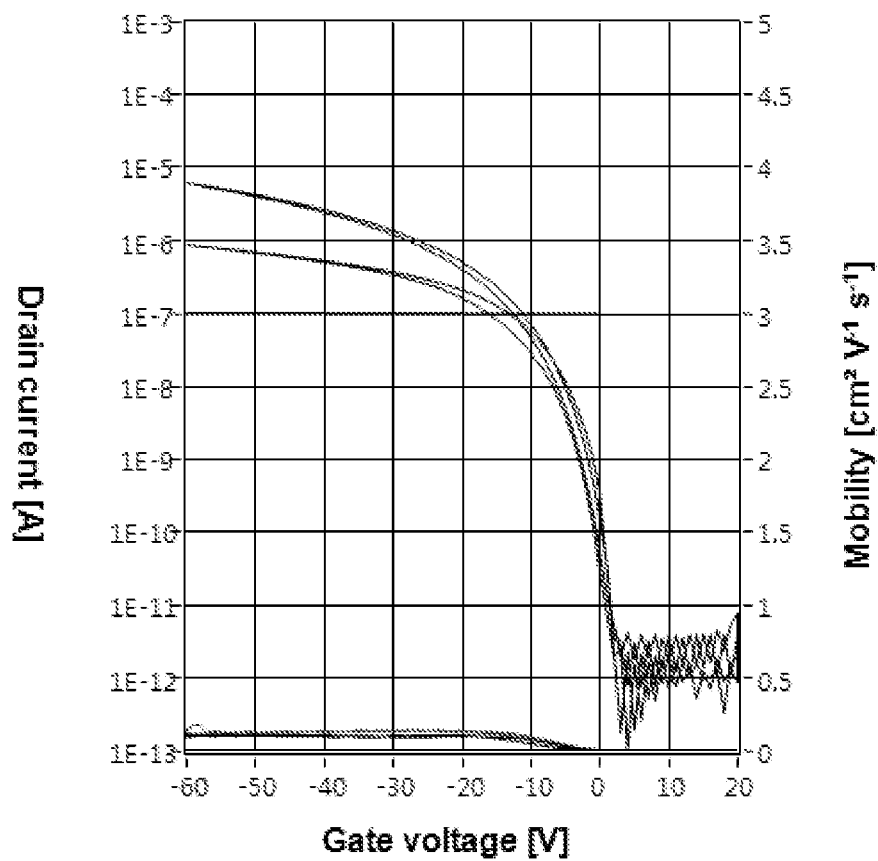
FIG. 4 is the transfer curve of a top gate organic field effect transistor device of the Example.

As shown in FIG. 4 and the data of Table I, the resulting electronic device is characterized by good properties. In fact, it has come as a surprise that the properties of the electronic device produced in accordance with the present invention are comparable to the properties of conventional fully ink-jet printed electronic devices, and this with a simplified production process.

TABLE I

| | |
|---|---|
| Saturated mobility $\mu_{sat}$ | 0.18 cm$^2$ V$^{-1}$ s$^{-1}$ |
| Linear mobility $\mu_{lin}$ | 0.12 cm$^2$ V$^{-1}$ s$^{-1}$ |
| Off-current $I_{off}$ | $2.3 \cdot 10^{-12}$ A |
| Ratio of on-current to off-current in linear trace for gate voltage $V_g = 5$ V | $3.7 \cdot 10^5$ |
| Gate leakage current $I_g$ | $8 \cdot 10^{-11}$ A |

The data for off-current and gate leakage current obtained for the present electronic device clearly show that the semiconductor material is effectively confined to a well-defined area, thus demonstrating the feasibility of the present process of forming bank structures in an organic electronic device.

The invention claimed is:

1. A process for preparing an electronic device, wherein a layer is selectively swelled with a swelling solvent, thereby forming bank structures, which define a well.

2. A process according to claim 1, said process comprising the following steps:
  a) depositing a material comprising a polycycloolefinic polymer on a substrate to form a layer; and
  b) selectively swelling said layer with a swelling solvent, thereby forming bank structures, which define a well.

3. A process according to claim 2, wherein the polycycloolefinic polymer is a norbornene-type polymer.

4. A process according to claim 2, wherein the polycycloolefinic polymer comprises two or more distinct types of repeating units.

5. A process according to claim 2, wherein the polycycloolefinic polymer comprises a repeating unit comprising a pendant crosslinkable group.

6. A process according to claim 2, wherein the polycycloolefinic polymer comprises a repeating unit, which comprises a substituted or unsubstituted maleimide portion, an epoxide portion, a vinyl portion, an acetylene portion, an indenyl portion, a cinnamate portion or a coumarin portion.

7. A process according to claim 2, wherein the polycycloolefinic polymer comprises a repeating unit derived from

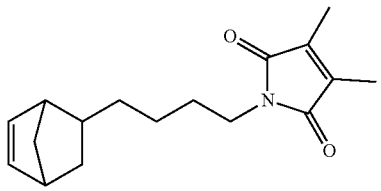

8. A process according to claim 1, wherein the electronic device is an Organic Field Effect Transistor, Organic Thin Film Transistor, Organic Light Emitting Diode, or Organic Photovoltaic device.

9. A process according to claim 1, wherein the swelling solvent is of formula $(R^x-O-R^y)$, $(R^x-C(=O)H)$, $(R^x-OH)$, $(R^x-C(=O)-R^y)$, $(R^x-C(=O)OH)$, $(R^x-C(=O)O-R^y)$, $(HO-(CR^xR^y-)_s COOH)$, or $(HO-(CR^xR^y-)_s COOR^z)$, wherein $R^z$, $R^x$ and $R^y$ are independently from one another hydrogen or an alkyl group having from 1 to 10 carbon atoms, provided that either $R^x$ or $R^y$ is different from hydrogen, and wherein an alkyl group may be linear or branched, and in which alkyl group a hydrogen is optionally replaced by —OH.

10. A process according to claim 9, wherein $R^z$ is methyl, ethyl, propyl or butyl.

11. A process for preparing an electronic device, wherein a layer is selectively swelled with a swelling solvent, thereby forming bank structures, which define a well,
wherein one of the following conditions have been met:
condition 1:
wherein the process comprises the following steps:
    a') depositing a material comprising a polycycloolefinic polymer on a substrate to form a layer;
    b') exposing a part of the surface of said layer to actinic radiation; and
    c') selectively swelling said layer with a swelling solvent, thereby forming bank structures, which define a well;
condition 2:
wherein the process comprises the following steps:
    I-a) providing a substrate (1);
    I-b) forming a gate electrode (2) on said substrate (1);
    I-c) depositing a dielectric material comprising a polycycloolefinic polymer on said gate electrode (2) and said substrate (1) to form a dielectric layer (3);
    I-d) forming source and drain electrodes (5) on said dielectric layer (3), such that said source and drain electrodes (5) are spaced apart with a channel region (6) located between said source and drain electrodes (5);
    I-e) exposing a part of the surface of said dielectric layer (3) to actinic radiation such that the exposed part extends at least over the channel region (6);
    I-f) subsequently swelling said dielectric layer (3) with a swelling solvent, thereby forming bank structures (8*a*, 8*b*), which define a well that extends at least over the channel region; and
    I-g) depositing a layer of semiconductor material (7) in said well defined by said bank structures (8*a*, 8*b*);
condition 3:
wherein the process comprises the following steps:
    II-a) providing a substrate (1);
    II-b) forming a gate electrode (2) on said substrate (1);
    II-c) depositing a dielectric material comprising a polycycloolefinic polymer on said gate electrode (2) and said substrate (1) to form a dielectric layer (3);
    II-d) exposing a part of the surface of said dielectric layer (3) to actinic radiation;
    II-e) subsequently swelling said dielectric layer (3) with a swelling solvent, thereby forming bank structures (8*a*, 8*b*), which define a well;
    II-f) forming source and drain electrodes (5) in the well on said dielectric layer (3), such that source and drain electrodes (5) are spaced apart with a channel region (6) located between said source and drain electrodes (5);
    II-g) depositing a layer of semiconductor material (7) in said well defined by said bank structures (8*a*, 8*b*);
condition 4:
wherein the process comprises the following steps:
    III-a) providing a substrate (1');
    III-b) depositing a dielectric material comprising a polycycloolefinic polymer on said substrate (1') to form a planarization layer (4');
    III-c) forming source and drain electrodes (5') on said planarization layer (4') such that said source and drain electrodes (5') are spaced apart with a channel region (6') located between said source and drain electrodes (5');
    III-d) exposing a part of the surface of said planarization layer (4') to actinic radiation such that the exposed part extends at least over the channel region (6');
    III-e) subsequently swelling said planarization layer (4') in a swelling solvent, thereby forming bank structures (8*a*', 8*b*'), which define a well that extends at least over the channel region (6');
    III-f) depositing a layer of semiconductor material (7') in the well defined by said bank structures (8*a*', 8*b*');
    III-g) subsequently depositing a further dielectric material to form a gate insulator layer (10'); and
    III-h) forming a gate electrode (2') on said gate insulator layer (10');
condition 5:
wherein the process comprises the following steps:
    IV-a) providing a substrate (1');
    IV-b) depositing a dielectric material comprising a polycycloolefinic polymer on said substrate (1') to form a planarization layer (4');
    IV-c) exposing a part of the surface of said planarization layer (4') to actinic radiation;
    IV-d) subsequently swelling said planarization layer (4') in a swelling solvent, thereby forming bank structures (8*a*', 8*b*'), which define a well;
    IV-e) forming source and drain electrodes (5') on said planarization layer (4') such that said source and drain electrodes are spaced apart with a channel region (6') located between said source and drain electrodes (5');

IV-f) depositing a layer of semiconductor material (7') in the well defined by said bank structures (8a', 8b');

IV-g) subsequently depositing a further dielectric material to form a gate insulator material (10'); and IV-h) forming a gate electrode (2') on said gate insulator layer (10');

condition 6:

wherein, in the process according to condition 2, 3, 4 or 5, the exposed part and the well extend at least over the channel region and at least part of either source or drain electrode or both, source and drain electrode;

condition 7:

wherein the swelling solvent is an organic compound comprising a chemical group selected from the group consisting of —O—, —OH, —C(=O)—, —C(=O)O— and —COOH;

condition 8:

wherein the swelling solvent is an organic compound comprising the chemical groups —OH and —C(=O)O—;

condition 9:

wherein the swelling solvent is of formula HO—$(CR^xR^y—)_s COOR^z$, wherein $R^z$, $R^x$ and $R^y$ are independently from one another hydrogen or an alkyl group having from 1 to 10 carbon atoms and s is 1, 2 or 3;

condition 10:

wherein the swelling solvent is ethyl lactate ($H_5C_2$—O—C(=O)—C(OH)—$CH_3$);

condition 11:

wherein the electronic device is a top gate Organic Field Effect Transistor or a bottom gate Organic Field Effect Transistor.

12. A process according to claim 11, said process comprising the following steps:

a') depositing a material comprising a polycycloolefinic polymer on a substrate to form a layer;

b') exposing a part of the surface of said layer to actinic radiation; and c') selectively swelling said layer with a swelling solvent, thereby forming bank structures, which define a well.

13. A process according to claim 11, said process comprising the following steps:

I-a) providing a substrate (1);

I-b) forming a gate electrode (2) on said substrate (1);

I-c) depositing a dielectric material comprising a polycycloolefinic polymer on said gate electrode (2) and said substrate (1) to form a dielectric layer (3);

I-d) forming source and drain electrodes (5) on said dielectric layer (3), such that said source and drain electrodes (5) are spaced apart with a channel region (6) located between said source and drain electrodes (5);

I-e) exposing a part of the surface of said dielectric layer (3) to actinic radiation such that the exposed part extends at least over the channel region (6);

I-f) subsequently swelling said dielectric layer (3) with a swelling solvent, thereby forming bank structures (8a, 8b), which define a well that extends at least over the channel region; and I-g) depositing a layer of semiconductor material (7) in said well defined by said bank structures (8a, 8b).

14. A process according to claim 13, wherein the exposed part and the well extend at least over the channel region and at least part of either source or drain electrode or both, source and drain electrode.

15. A process according to claim 11, said process comprising the following steps:

II-a) providing a substrate (1);

II-b) forming a gate electrode (2) on said substrate (1);

II-c) depositing a dielectric material comprising a polycycloolefinic polymer on said gate electrode (2) and said substrate (1) to form a dielectric layer (3);

II-d) exposing a part of the surface of said dielectric layer (3) to actinic radiation;

II-e) subsequently swelling said dielectric layer (3) with a swelling solvent, thereby forming bank structures (8a, 8b), which define a well;

II-f) forming source and drain electrodes (5) in the well on said dielectric layer (3), such that source and drain electrodes (5) are spaced apart with a channel region (6) located between said source and drain electrodes (5);

II-g) depositing a layer of semiconductor material (7) in said well defined by said bank structures (8a, 8b).

16. A process according to claim 15, wherein the exposed part and the well extend at least over the channel region and at least part of either source or drain electrode or both, source and drain electrode.

17. A process according to claim 11, said process comprising the following steps III-a) providing a substrate (1');

III-b) depositing a dielectric material comprising a polycycloolefinic polymer on said substrate (1') to form a planarization layer (4');

III-c) forming source and drain electrodes (5') on said planarization layer (4') such that said source and drain electrodes (5') are spaced apart with a channel region (6') located between said source and drain electrodes (5');

III-d) exposing a part of the surface of said planarization layer (4') to actinic radiation such that the exposed part extends at least over the channel region (6');

III-e) subsequently swelling said planarization layer (4') in a swelling solvent, thereby forming bank structures (8a', 8b'), which define a well that extends at least over the channel region (6');

III-f) depositing a layer of semiconductor material (7') in the well defined by said bank structures (8a', 8b');

III-g) subsequently depositing a further dielectric material to form a gate insulator layer (10'); and III-h) forming a gate electrode (2') on said gate insulator layer (10').

18. A process according to claim 11, said process comprising the following steps:

IV-a) providing a substrate (1');

IV-b) depositing a dielectric material comprising a polycycloolefinic polymer on said substrate (1') to form a planarization layer (4');

IV-c) exposing a part of the surface of said planarization layer (4') to actinic radiation;

IV-d) subsequently swelling said planarization layer (4') in a swelling solvent, thereby forming bank structures (8a', 8b'), which define a well;

IV-e) forming source and drain electrodes (5') on said planarization layer (4') such that said source and drain electrodes are spaced apart with a channel region (6') located between said source and drain electrodes (5');

IV-f) depositing a layer of semiconductor material (7') in the well defined by said bank structures (8a', 8b');

IV-g) subsequently depositing a further dielectric material to form a gate insulator material (10'); and IV-h) forming a gate electrode (2') on said gate insulator layer (10').

19. A process according to claim 11, wherein the swelling solvent is an organic compound comprising a chemical group selected from the group consisting of —O—, —OH, —C(=O)—, —C(=O)O— and —COOH.

20. A process according to claim 11, wherein the swelling solvent is an organic compound comprising the chemical groups —OH and —C(=O)O—.

21. A process according to claim 11, wherein the swelling solvent is of formula HO—(CR$^x$R$^y$—)$_s$COOR$^z$, wherein R$^z$, R$^x$ and R$^y$ are independently from one another hydrogen or an alkyl group having from 1 to 10 carbon atoms and s is 1, 2 or 3.

22. A process according to claim 21, wherein R$^z$ is methyl, ethyl, propyl or butyl.

23. A process according to claim 11, wherein the swelling solvent is ethyl lactate (H$_5$C$_2$—O—C(=O)—C(OH)—CH$_3$).

24. A process according to claim 11, wherein the electronic device is a top gate Organic Field Effect Transistor or a bottom gate Organic Field Effect Transistor.

\* \* \* \* \*